(12) United States Patent
Bina et al.

(10) Patent No.: US 12,003,231 B2
(45) Date of Patent: Jun. 4, 2024

(54) DOUBLE GATE TRANSISTOR DEVICE AND METHOD OF OPERATING

(71) Applicant: Infineon Technologies Austria AG, Villach (AT)

(72) Inventors: Markus Bina, Kolbermoor (DE); Jens Barrenscheen, Munich (DE); Anton Mauder, Kolbermoor (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 148 days.

(21) Appl. No.: 16/722,809

(22) Filed: Dec. 20, 2019

(65) Prior Publication Data

US 2020/0136608 A1 Apr. 30, 2020

Related U.S. Application Data

(63) Continuation of application No. 15/439,706, filed on Feb. 22, 2017, now Pat. No. 10,530,360, which is a
(Continued)

(51) Int. Cl.
*H03K 17/567* (2006.01)
*H01L 29/08* (2006.01)
(Continued)

(52) U.S. Cl.
CPC ....... *H03K 17/567* (2013.01); *H01L 29/0895* (2013.01); *H01L 29/407* (2013.01); *H01L 29/41766* (2013.01); *H01L 29/4236* (2013.01); *H01L 29/7397* (2013.01); *H01L 29/7606* (2013.01); *H01L 29/7786* (2013.01);
(Continued)

(58) Field of Classification Search
CPC ............... H01L 29/0684; H01L 29/407; H01L 29/4236; H01L 29/41766; H01L 29/7397; H01L 29/7606; H01L 29/7786; H01L 29/7788; H01L 29/7813; H01L 29/7831
See application file for complete search history.

(56) References Cited

U.S. PATENT DOCUMENTS 5,561,393 A 10/1996 Sakurai et al.
9,595,602 B2 3/2017 Hashimoto et al.
(Continued)

FOREIGN PATENT DOCUMENTS

JP H06351225 A 12/1994
JP 2010186925 A 8/2010
(Continued)

OTHER PUBLICATIONS

Uemoto, Yasuhiro et al., "Gate Injection Transistor (GIT)—A Normally-Off AlGaN/GaN Power Transistor Using Conductivity Modulation", IEEE Transactions on Electron Devices, vol. 54, No. 12, Dec. 2007, pp. 3393-3399.

*Primary Examiner* — Patrick C Chen
(74) *Attorney, Agent, or Firm* — Slater Matsil, LLP

(57) ABSTRACT

In accordance with an embodiment, a method includes switching on a transistor device by generating a first conducting channel by driving a first gate electrode and, before generating the first conducting channel, generating a second conducting channel by driving a second gate electrode, wherein the second gate electrode is adjacent the first gate electrode in a current flow direction of the transistor device.

20 Claims, 10 Drawing Sheets

Related U.S. Application Data continuation-in-part of application No. 15/056,392, filed on Feb. 29, 2016, now Pat. No. 10,276,681.

(51) Int. Cl.

| | |
|---|---|
| *H01L 29/10* | (2006.01) |
| *H01L 29/20* | (2006.01) |
| *H01L 29/40* | (2006.01) |
| *H01L 29/417* | (2006.01) |
| *H01L 29/423* | (2006.01) |
| *H01L 29/739* | (2006.01) |
| *H01L 29/76* | (2006.01) |
| *H01L 29/778* | (2006.01) |
| *H01L 29/78* | (2006.01) |
| *H03K 17/687* | (2006.01) |

(52) U.S. Cl.
CPC ...... *H01L 29/7788* (2013.01); *H01L 29/7813* (2013.01); *H01L 29/7831* (2013.01); *H03K 17/687* (2013.01); *H01L 29/1066* (2013.01); *H01L 29/2003* (2013.01); *H03K 2017/6878* (2013.01)

(56) References Cited

U.S. PATENT DOCUMENTS

| | | | |
|---|---|---|---|
| 9,653,642 B1* | 5/2017 | Raring | H01L 33/0093 |
| 9,742,277 B2* | 8/2017 | Hirler | H02M 3/158 |
| 2003/0173619 A1 | 9/2003 | Feldtkeller et al. | |
| 2005/0161768 A1 | 7/2005 | Sugiyama et al. | |
| 2009/0166728 A1 | 7/2009 | Pan | |
| 2011/0284928 A1 | 11/2011 | Shibata et al. | |
| 2012/0183005 A1 | 7/2012 | Hoffman et al. | |
| 2012/0267636 A1* | 10/2012 | Zundel | H01L 29/872 257/76 |
| 2013/0069117 A1 | 3/2013 | Yoshioka et al. | |
| 2013/0200940 A1 | 8/2013 | Honda et al. | |
| 2014/0091852 A1 | 4/2014 | Norling et al. | |
| 2014/0103969 A1* | 4/2014 | Jeon | H01L 29/7786 327/109 |
| 2014/0191240 A1 | 7/2014 | Chiang et al. | |
| 2014/0264431 A1* | 9/2014 | Lal | H01L 29/0619 257/121 |
| 2015/0041850 A1 | 2/2015 | Saikaku et al. | |
| 2015/0115325 A1* | 4/2015 | Vielemeyer | H01L 29/41766 257/194 |
| 2015/0228773 A1* | 8/2015 | Tajiri | H01L 29/7787 257/194 |
| 2015/0255590 A1* | 9/2015 | Ostermaier | H01L 29/1066 257/194 |
| 2015/0349105 A1* | 12/2015 | Curatola | H01L 29/205 257/76 |
| 2016/0254750 A1 | 9/2016 | Grezaud et al. | |
| 2017/0026034 A1 | 1/2017 | Akiyama | |
| 2017/0110448 A1* | 4/2017 | Prechtl | H01L 27/0883 |
| 2017/0141677 A1 | 5/2017 | Hashimoto et al. | |
| 2017/0192049 A1 | 7/2017 | Tavernier et al. | |

FOREIGN PATENT DOCUMENTS

| | | |
|---|---|---|
| JP | 2012049499 A | 3/2012 |
| JP | 2012248752 A | 12/2012 |
| JP | 2012248753 A | 12/2012 |
| JP | 2013069785 A | 4/2013 |
| JP | 2014078710 A | 5/2014 |
| JP | 2014187085 A | 10/2014 |
| WO | 2012081237 A | 6/2012 |

* cited by examiner

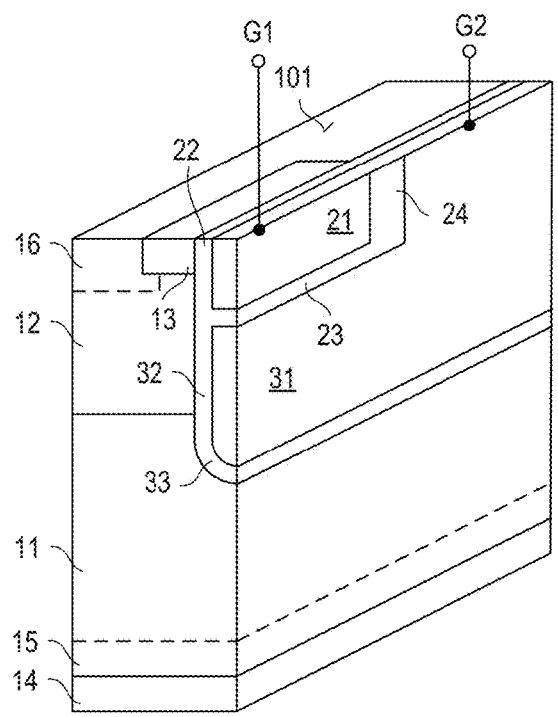
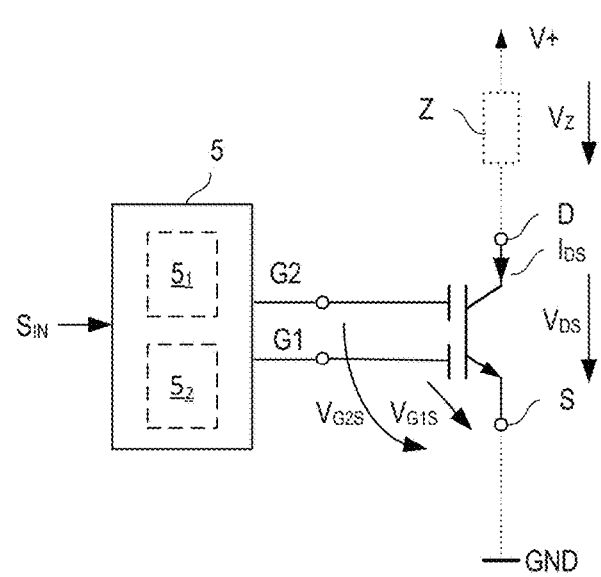
FIG 4
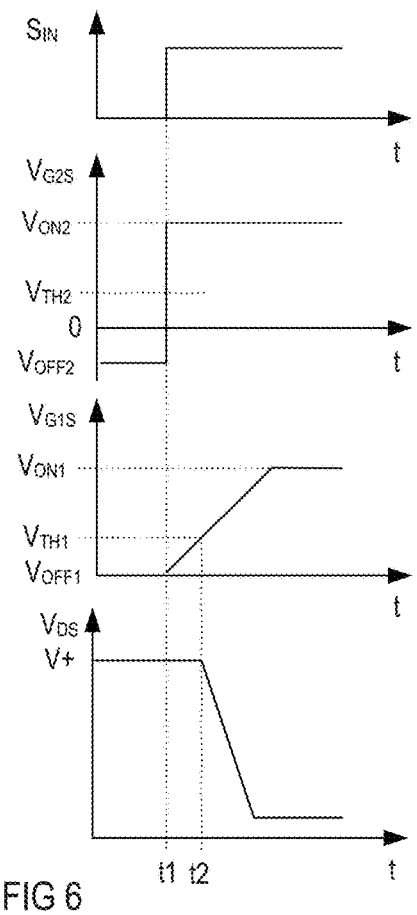
FIG 6
FIG 5
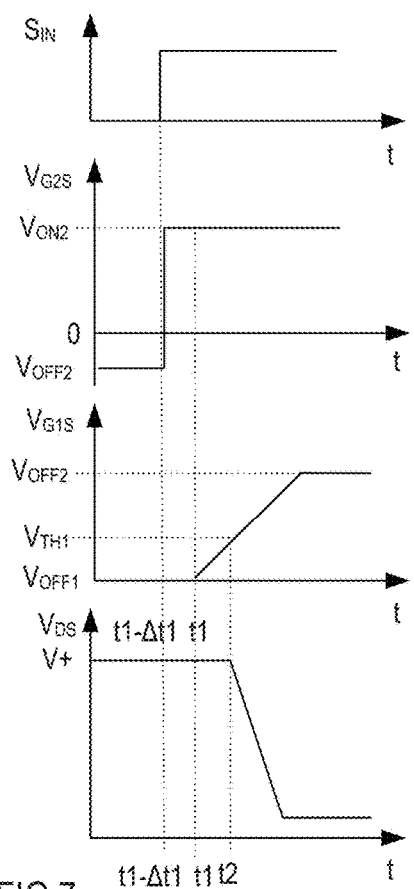
FIG 7

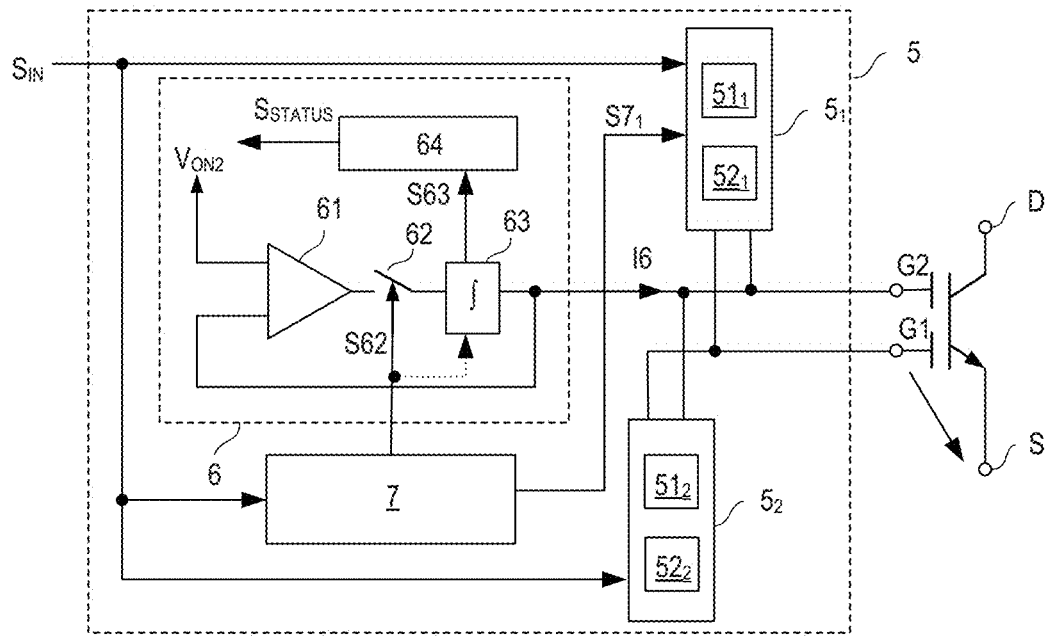
FIG 21
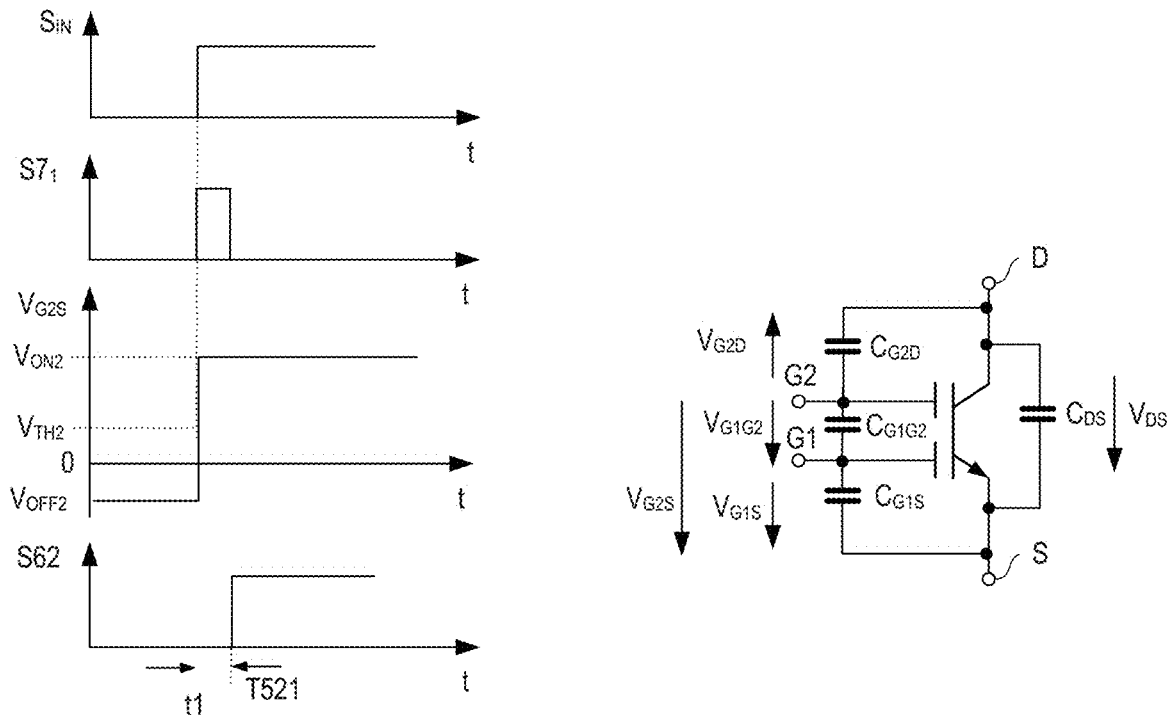
FIG 22
FIG 23

DOUBLE GATE TRANSISTOR DEVICE AND METHOD OF OPERATING

This application is a continuation of U.S. patent application Ser. No. 15/439,706, filed on Feb. 22, 2017, which application is a continuation in part based on U.S. patent application Ser. No. 15/056,392, filed on Feb. 29, 2016, now U.S. Pat. No. 10,276,681, which applications are hereby incorporated herein by reference in their entirety.

TECHNICAL FIELD

This disclosure in general relates to a transistor device, in particular a field-effect controlled power transistor device.

BACKGROUND

Field-effect controlled power transistor devices, such as power MOSFETs (Metal Oxide Field-Effect Transistors) or power IGBT's (Insulated Gate Bipolar Transistors) are widely used in automotive, industrial, or consumer electronic applications for driving loads, converting power, or the like. Such power transistors are available with voltage blocking capabilities of between several 10 volts (V) and several kilovolts (kV) and current ratings of between several amperes (A) and several kiloamperes (kA). The "voltage blocking capability" defines the maximum voltage the transistor device can withstand in an off-state (when switched off), and the "current rating" defines a maximum current the transistor device can conduct in the on-state (when switched on).

A field-effect controlled power transistor device switches on and off dependent on a voltage level of a drive voltage applied between a drive node (often referred to as gate node) and a load node (often referred to as source node or emitter node). A normally-off device (enhancement device) is in the off state when the drive voltage is zero so that a device of this type can be switched off by setting the drive voltage to zero. In operation of a power transistor device parasitic voltage spikes may occur at the gate node when the transistor device is in the off-state. Those voltage spikes may result from rapid changes of currents through parasitic inductances, such as line inductances; rapid current changes may result from switching operations of other power transistors in a circuit where the power transistor is employed.

There is a need to provide a transistor device that is robust against parasitic voltage spikes and can be controlled (switched on and off) in an efficient way, and a method for operating such transistor device in an efficient way.

SUMMARY OF THE INVENTION

One example relates to a method. The method includes switching on a transistor device by generating a first conducting channel by driving a first gate electrode and, before generating the first conducting channel, generating a second conducting channel by driving a second gate electrode. The second gate electrode is adjacent the first gate electrode in a current flow direction of the transistor device.

Another example of a method includes switching off a transistor device by interrupting a first conducting channel by driving a first gate electrode and, after interrupting the first conducting channel, interrupting a second conducting channel by driving a second gate electrode. The second gate electrode is arranged adjacent the first gate electrode in a current flow direction of the transistor device.

Another example relates to a transistor device with at least one transistor cell. The wherein the at least one transistor cell includes a drift region, a body region, a source region and a drain region, wherein the body region is arranged between the source region and the drift region, and wherein the drift region is arranged between body region and the drain region. A gate electrode is dielectrically insulated from the body region by a first gate dielectric, and a second gate electrode is dielectrically insulated from the body region by a second gate dielectric, arranged adjacent the first gate electrode, and separated from the first gate electrode by a separation layer.

A transistor device according to another example includes a semiconductor body with a first semiconductor layer and a second semiconductor layer adjoining the first semiconductor layer. The first semiconductor layer includes a first type of group III nitride, and the second semiconductor layer includes a second type group III nitride. A source electrode is connected to the first semiconductor layer and the second semiconductor layer, a drain electrode is spaced apart from the source electrode and connected to the first semiconductor layer and the second semiconductor layer, and a first gate electrode and a second gate electrode that are spaced apart in a current flow direction of the transistor device.

One example relates to a method. The method includes switching on a transistor device by generating a first conducting channel in a body region by driving a first gate electrode and, before generating the first conducting channel, generating a second conducting channel in the body region by driving a second gate electrode. The first gate electrode is dielectrically insulated from a body region by a first gate dielectric. The second gate electrode is dielectrically insulated from the body region by a second gate dielectric, arranged adjacent to the first gate electrode, and separated from the first gate electrode by a separation layer, and the body region is arranged between a source region and a drift region, and wherein the drift region is arranged between body region and a drain region.

One example relates to a method. The method includes switching off a transistor device by interrupting a first conducting channel in a body region by driving a first gate electrode and, after interrupting the first conducting channel, interrupting a second conducting channel in the body region by driving a second gate electrode. The first gate electrode is dielectrically insulated from a body region by a first gate dielectric. The second gate electrode is dielectrically insulated from the body region by a second gate dielectric, arranged adjacent the first gate electrode, and separated from the first gate electrode by a separation layer. The body region is arranged between a source region and a drift region, and wherein the drift region is arranged between body region and a drain region.

One example relates to a method. The method includes driving a first gate electrode of a transistor device and monitoring at least one electrical parameter of a second gate electrode of the transistor device. The first gate electrode is dielectrically insulated from a body region by a first gate dielectric. The second gate electrode is dielectrically insulated from the body region by a second gate dielectric, arranged adjacent the first gate electrode, and separated from the first gate electrode by a separation layer. The body region is arranged between a source region and a drift region, and wherein the drift region is arranged between body region and a drain region.

Another example relates to a transistor device. The transistor device includes at least one transistor cell. The at least one transistor cell includes a drift region, a body region, a source region and a drain region. The body region is arranged between the source region and the drift region, and the drift region is arranged between body region and the drain region. The transistor device further includes a first gate electrode dielectrically insulated from the body region by a first gate dielectric, and a second gate electrode. The second gate electrode is dielectrically insulated from the body region by a second gate dielectric, is arranged adjacent the first gate electrode, and is separated from the first gate electrode by a separation layer.

Another example relates to a drive circuit. The drive circuit includes an input configured to receive an input signal a first output configured to be coupled to a first gate node of a transistor device, and a second output configured to be coupled to a second gate node of a transistor device configured to. The drive circuit is configured to drive the first gate node and the second gate node based on the input signal, and to detect an operation state of the transistor device based on monitoring at least one electrical parameter at the second output.

Yet another example relates to a drive circuit. The drive circuit includes an input configured to receive an input signal, a first output configured to be coupled to a first gate node of a transistor device, and a second output configured to be coupled to a second gate node of a transistor device. The drive circuit is configured to operate in a diagnostic mode, wherein in the diagnostic mode, the transistor device is configured to diagnose the transistor device based on driving the first gate node via the first output and monitoring at least one electrical parameter at the second output.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features:

FIG. 4 shows a perspective sectional view of one transistor cell of a double gate transistor device according to one example;

FIG. 5 shows an electronic circuit that illustrates the use of a double gate transistor device as an electronic switch;

FIG. 6 shows timing diagrams that illustrate one example of how a double gate transistor device can be switched on;

FIG. 7 shows timing diagrams that illustrate another example of how a double gate transistor device can be switched on;

FIG. 21 shows one example of the detection circuit in greater detail;

FIG. 22 shows timing diagrams that illustrate operation of the detection circuit shown in FIG. 21;

FIG. 23 shows an equivalent circuit diagram of a double gate transistor device; and;

DETAILED DESCRIPTION OF ILLUSTRATIVE EMBODIMENTS

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
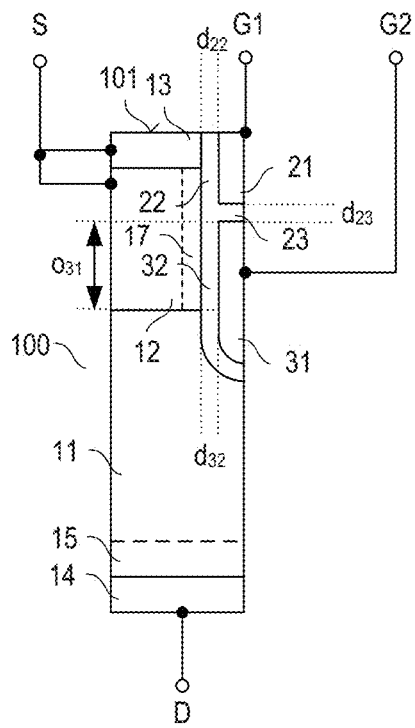
FIG. 1 shows a vertical cross-sectional view of one transistor cell of a double gate transistor device according to one example.

FIG. 1 shows a vertical cross sectional view of one transistor cell of a double gate transistor device according to one example. The transistor cell includes a drift region 11, a body region 12, a source region 13 and a drain region 14. The body region 12 is arranged between the drift region 11 and the source region 13, and the drift region 11 is arranged between the body region 12 and the drain region 14. These regions, which may briefly be referred to as active device regions, are doped semiconductor regions arranged in a semiconductor body 100. The semiconductor body 100 may include a conventional semiconductor material such as, for example, silicon (Si), silicon carbide (SiC), gallium arsenide (GaAs), gallium nitride (GaN), or the like.

Referring to FIG. 1, the transistor cell further includes a first gate electrode 21 dielectrically insulated from the body region 12 by a first gate dielectric 22, and a second gate electrode 31 dielectrically insulated from the body region 12 by a second gate dielectric 32. The second gate electrode 31 is arranged adjacent the first gate electrode 21 and is separated from the first gate electrode 21 by a separation layer 23. The first gate electrode 21 is electrically connected to a gate node G1, and the second gate electrode 31 is electrically connected to a second gate node G2 different from the first gate node G1. These gate nodes G1, G2 are only schematically illustrated in FIG. 1. According to one example, the separation layer 23 includes a dielectric layer. According to one example, the first gate dielectric 22, the second gate dielectric 32 and the separation layer 23 include the same type of material such as, for example, an oxide, a nitride, an oxy-nitride, or the like.

The first gate dielectric 22 has a first thickness $d_{22}$, which defines a shortest distance between the first gate electrode 21 and the body region 12, and the second gate dielectric 32 has a second thickness $d_{32}$, which defines the shortest distance between the second gate electrode 31 and the body region 12. According to one example, these thicknesses $d_{22}$, $d_{32}$ are substantially equal, so that $d_{22}=d_{32}$. According to another example, one of is less than twice of the other one of the first thickness $d_{22}$ and the second thickness $d_{32}$, that is, $0.5 \leq d_{22}/d_{32} \leq 2$.

Each of the first gate dielectric 22 and the second gate dielectric 32 adjoins the body region 12. Furthermore, the first gate dielectric 22 adjoins the source region 13 and the second gate dielectric 32 adjoins the drift region 11. Thus, the first gate electrode 21 is adjacent the source region 13 additionally to being adjacent to the body region 12, and the second gate electrode 31 is adjacent the drift region 11 additionally to being adjacent to the body region 12.

The transistor device can be implemented as an n-type transistor device or a p-type transistor device. The type of the transistor device is defined by a doping type of the source region 13. The source region 13 is n-doped in an n-type transistor device and p-doped in a p-type transistor device. A doping type of the body region 12 is complementary to the doping type of the source region 13, so that the body region 12 is p-doped in an n-type transistor device and n-doped in a p-type transistor device. A doping type of the drift region 11 equals the doping type of the source region 13 and is complementary to the doping type of the body region 12, so that a pn-junction is formed between the body region 12 and the drift region 11.

The transistor device can, for example, be implemented as an IGBT or as a MOSFET. In an IGBT a doping type of the drain region 14 is complementary to the doping type of the drift region 11 and the source region, respectively, and in a MOSFET the doping type of the drain region 14 equals the doping type of the drift region 11 and the source region 13, respectively. Optionally, the transistor device includes a field-stop region 15 of the same doping type as the drift region 11 between the drift region 11 and the drain region 14. A doping concentration of the field-stop region 15 is higher than the doping concentration of the drift region 11 and lower than the doping concentration of the drain region 14.

Further, the transistor device can be implemented as a normally-off device (enhancement device) or a normally-on device (depletion device). In a normally-off device, the body region 12 adjoins the gate dielectrics 22, 32. The normally-off device can be switched on or off by controlling an inversion channel in the body region 12 along the gate dielectrics. This is explained in further detail below. In a normally-on device, the body region 12 includes a channel region 17 (illustrated in dashed lines in FIG. 1) of the same doping type as the source region 13 and the drift region 11 that adjoins the gate dielectrics 22, 32. The normally-on device can be switched on or off by depleting or not depleting the channel region 17. This is also explained in further detail below.

For example, a doping concentration of the drift region 11 is selected from a range of between $1E12$ cm$^{-3}$ and $1E15$ cm$^{-3}$, between $5E12$ cm$^{-3}$ and $1E14$ cm$^{-3}$, or $7E12$ cm$^{-3}$ and $1E13$ cm$^{-3}$, a doping concentration of the optional field-stop region 15 is selected from a range of between $1E15$ cm$^{-3}$ and $1E16$ cm$^{-3}$, a doping concentration of the body region 12 is selected from a range of between $1E16$ cm$^{-3}$ and $5E18$ cm$^{-3}$, a doping concentration of the source region 13 is higher than $1E19$ cm$^{-3}$, and a doping concentration of the channel region may be selected from the same range as the doping concentration of the body region 12. In a MOSFET, a doping concentration of the drain region 13 is higher than $1E18$ cm$^{-3}$ or higher than $1E19$ cm$^{-3}$, for example. In an IGBT (where the drain region 14 can also be referred to as collector region), a doping concentration of the drain region 13 is higher than $1E17$ cm$^{-3}$ or higher than $1E18$ cm$^{-3}$, for example. According to one example, the doping concentration of the drain region 14 is at least $1E3$ times, $1E4$ times, or at least $1E5$ times the doping concentration of the drift region 11.

The transistor cell shown in FIG. 1 is a vertical transistor cell. That is, the source region 13 and the drain region 14 are spaced apart in a vertical direction of the semiconductor body 100. The "vertical direction" of the semiconductor body 100 is a direction perpendicular to a first surface 101 of the semiconductor body 100. The first gate electrode 21 and the second gate electrode 22 are located in one trench that extends from the first surface 101 into the semiconductor body 100. By this, the first gate electrode 21 and the second gate electrode 22 are adjacent in the vertical direction of the semiconductor body 100, whereas the first gate electrode 21 is closer to the first surface 101 than the second gate electrode 31. The method for driving a transistor device however, is not restricted to be used in a vertical transistor device, but may as well be used in a lateral transistor device. A lateral transistor device is a transistor device in which a drain region and a source region are spaced apart in a lateral direction of a semiconductor body. The lateral direction is a direction parallel to a (main) surface of the semiconductor body.

Figure 2A:
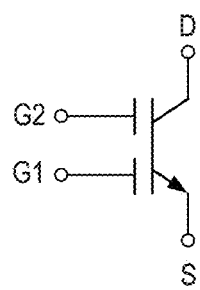
FIG. 2A shows the circuit symbol of a double gate transistor device implemented as an IGBT.
Figure 2B:
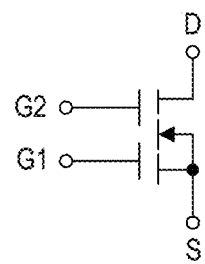
FIG. 2B shows the circuit symbol of a double gate transistor device implemented as a MOSFET.

FIG. 2A shows a circuit symbol of a double gate transistor device implemented as an IGBT. This circuit symbol is based on the circuit symbol of a conventional IGBT and is different from the circuit symbol of a conventional IGBT in that it includes two gate nodes, namely the first gate node G1 and a the gate node G2. FIG. 2B shows the circuit symbol of a double gate transistor device implemented as a MOSFET. The circuit symbol shown in FIG. 2B is based on the circuit symbol of a conventional MOSFET and is different from the circuit symbol of a conventional MOSFET in that it includes two gate nodes, namely the first gate node G1 and the second gate node G2. Just for the purpose of illustration, the circuit symbols shown in FIGS. 2A and 2B are drawn to represent n-type transistor devices.

According to one example, the transistor device includes a plurality of transistor cells of the type shown in FIG. 1.

Figure 3:
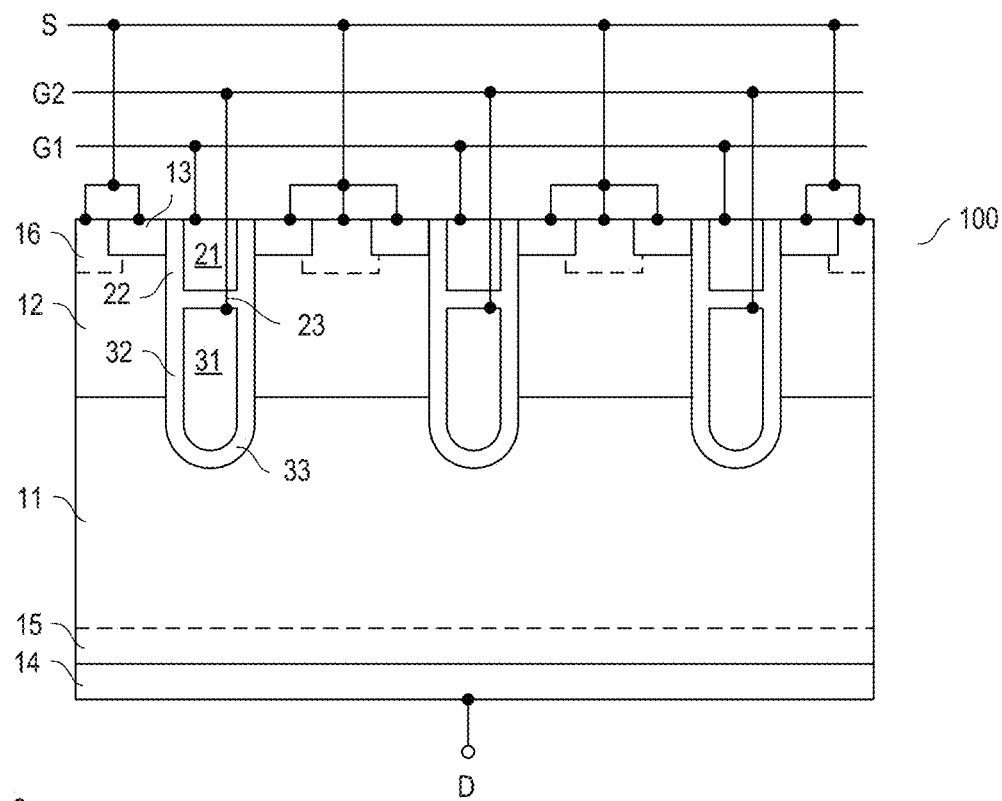
FIG. 3 shows a vertical cross-sectional view of one section of a double gate transistor device including a plurality of parallel connected transistor cells.

FIG. 3 shows a vertical cross sectional view of one section of a transistor device that includes a plurality of such transistor cells. These transistor cells are connected in parallel by having their first gate electrodes 21 connected to one common first gate node G1, by having their second gate electrodes 31 connected to a common second gate node G2, by having their source regions 13 electrically connected to a common source node S, and by having their drain regions 14 connected to a common drain node D. In the embodiment shown in FIG. 3, the drain regions of the individual transistor cells are formed by one common drain region 14 connected to the drain node D. Furthermore, the drift regions of the individual transistor cells are formed by one common drift region 11.

According to one example, the source regions 13 and the body regions 12 of the individual transistor cells are connected to the source node S. Referring to FIG. 3, the body regions 12 may include contact regions 16 connected to the source node S. These contact regions 16 have the same doping type as the body regions 12, are more highly doped than the body regions 12, and may provide an ohmic connection between the source node S and the body region 12.

In FIGS. 1 and 3, connections between the second gate electrode 31 and the second gate node G2 are only schematically illustrated. FIG. 4 shows a perspective sectional view of one transistor cell to illustrate how the second gate electrode 31 may be connected to the second gate node G2. In the embodiment shown in FIG. 4, a section of the second gate electrode 31 extends to the first surface 101 of the semiconductor body 100. By this, the second gate electrode 31, like the first gate electrode 21, can be contacted at the first surface 101 of the semiconductor body 100. In a region where the second gate electrodes 31 extend to the surface 101, the second gate electrode 31 is insulated from the first gate electrode 21 by a further separation layer 24. This further separation layer 24 may include the same type of material as the first gate dielectric 22, the second gate dielectric 32 and the separation layer 23. A thickness, which defines the shortest distance between the first gate electrode 21 and the second gate electrode 31, is greater than the first thickness $d_{22}$ of the first gate dielectric 22 and the second thickness $d_{32}$ of the second gate dielectric 32, for example.

The double gate transistor device explained above can be used as an electronic switch. FIG. 5 shows a circuit diagram that illustrates one example of how the double gate transistor device can be used as an electronic switch. Just for the purpose of illustration the double gate transistor device is drawn as an IGBT (as shown in FIG. 2A) in the circuit diagram shown in FIG. 5. In the circuit shown in FIG. 5, the transistor device is connected in series with a load Z (illustrated in dashed lines). In particular, the drain-source path D-S, which is an internal path of the transistor device between the drain node D and the source node S, is connected in series with the load Z. This series circuit with the transistor device and the load Z receives a supply voltage V+ which is available between a first supply node and a second supply node (ground node, GND), for example. The transistor device can be switched on and switched off. When the transistor device is switched on (is in the on-state) a current can flow via the drain-source path D-S and, therefore, through the load Z. When the transistor device is switched off (is in the off-state) it prevents a current to flow via the drain-source path D-S and, therefore, through the load Z. Examples of how the transistor device can be switched on and switched off are explained below.

Referring to FIG. 5, the double gate transistor device can be controlled (driven) by a drive circuit 5. This drive circuit 5 receives an input signal $S_{IN}$ and is connected to the first gate node G1 and the second gate node G2. According to one example, the drive signal $S_{IN}$ can have two different signal levels, an on-level indicating that the transistor device is to be switched on, and an off-level indicating that the transistor device is to be switched off. The drive circuit 5 is configured to drive the transistor device in accordance with the input signal $S_{IN}$. According to one example, the drive circuit 5 includes a first driver stage $5_1$ (illustrated in dashed lines in FIG. 5) configured to switch on the transistor device, and a second driver stage $5_2$ (illustrated in dashed lines in FIG. 5) configured to switch off the transistor device. Examples of these driver stages $5_1$, $5_2$ are explained with reference to drawings herein further below.

The double gate transistor device explained above is a voltage-controlled transistor device that switches on and off dependent on two drive voltages, namely a first drive voltage $V_{G1S}$ and a second drive voltage $V_{G2S}$. Referring to FIG. 5, the first drive voltage $V_{G1S}$ is a voltage between the first gate node G1 and the source node S, and the second drive voltage $V_{G2S}$ is a voltage between the second gate node G2 and the source node S. Each of these voltages controls a conducting channel in the body region 12. The first drive voltage $V_{G1S}$ controls a first conducting channel in the body region 12 along the first gate dielectric 22 and the second drive voltage $V_{G2S}$ controls a second conducting channel in the body region 12 along the second gate dielectric 32. These conducting channels are field-effect controlled channels. According to one example, these conducting channels are inversion channels in a normally-off device and accumulation channels in a normally-on device. The transistor device is in the on-state when there is a continuous conducting channel in the body region 12 along the first gate dielectric 22 and the second gate dielectric 22 between the source region 13 and the drift region 11. According to one example, if the transistor device is a normally-off device, the separation layer 23 is thin enough for the first conducting channel and the second conducting channel to overlap in the region of the separation layer 23 so that there can be continuous conducting channel in the body region 12 between the source region 13 and the drift region 11.

Referring to FIGS. 1, 3, and 4, none of the first gate electrode 21 and the second gate electrode 31 completely extends in a current flow direction of the transistor device from the source region 13 to the drift region 11 adjacent the body region 12. The "current flow direction" is a direction in which a current can flow through the transistor device between the source region 13 and the drain region 14 when the transistor device is in the on-state. In the examples shown in FIGS. 1, 3, and 4, the current flow direction of the transistor device is the vertical direction of the semiconductor body 100 (the vertical direction is the direction perpendicular to the first surface 101). In the current flow direction, the first gate electrode 21 is spaced apart from the drift region 11, and the second gate electrode 31 is spaced apart from the source region 13. Thus, the transistor device is only in the on-state when first drive voltage $V_{G1S}$ generates the first conducting channel along the first gate dielectric 22 and the second drive voltage $V_{G2S}$ generates the second conducting channel along the second gate dielectric 32. "To generate the conducting channel" may include to generate an inversion channel in a normally-off device or not to interrupt the conducting channel by not depleting the channel region 17 in a normally-on device. Consequently, the transistor device is in the off-state when at least one of these first and second conducting channels is interrupted.

FIG. 6 shows timing diagrams that illustrate one example of how the double gate transistor device can be driven from the off-state to the on-state. FIG. 6 shows timing diagrams of the input signal $S_{IN}$, the second drive voltage $V_{G2S}$, the first drive voltage $V_{G1S}$, and the drain-source voltage $V_{DS}$ of the double gate transistor device. Referring to the above, switching on the transistor device includes generating the first conducting channel in the body region 12 along the first gate dielectric 22 and generating the second conducting channel in the body region 12 along the second gate dielectric 32. In the method illustrated in FIG. 6, the second conducting channel is generated before the first conducting channel is generated. Generating the second conducting channel includes changing the second drive voltage $V_{G2S}$ from an off-level $V_{OFF2}$ to an on-level $V_{ON2}$. Just for the purpose of illustration, the off-level $V_{OFF2}$ is a negative level in the example shown in FIG. 6 and the on-level $V_{ON2}$ is a positive voltage level. This is applicable to an n-type double gate transistor device, and is applicable to a normally-off device and a normally-on device, wherein in a normally-on device the off-level may be chosen to be more negative than in a normally-off device. The off-level $V_{OFF2}$ is such that the second conducting channel in the body region 12 is safely prevented when the second drive voltage $V_{G2S}$ has the off-level $V_{OFF2}$, and the on-level $V_{ON2}$ is such that there is the second conducting channel in the body region 12 when the second drive voltage $V_{G2S}$ has the on-level $V_{ON2}$.

In FIG. 6, $V_{TH2}$ denotes a threshold voltage associated with the second drive voltage $V_{GS2}$. When the second drive voltage $V_{G2S}$ reaches the threshold $V_{TH2}$, which is between the off-level $V_{OFF2}$ and the on-level $V_{ON2}$, the second conducting channel starts to conduct. Increasing the second drive voltage $V_{G2S}$ to above the threshold $V_{TH2}$, as shown in FIG. 6, may help to increase a conductivity of the second conducting channel and, therefore, decrease the on-resistance of the transistor device in the on-state. The "on-resistance" of the transistor device is the electrical resistance of the transistor device between the drain node D and the source node S in the on-state. In FIG. 6, the threshold $V_{TH2}$ is drawn to be positive. This applies to an n-type normally-off type and is only an example. In an n-type normally-on device, for example, the threshold $V_{TH2}$ is zero or negative.

Referring to FIG. 6, generating the second conducting channel may include rapidly increasing the voltage level of the second drive voltage $V_{G2S}$ from the off-level $V_{OFF2}$ to the on-level $V_{ON2}$. This is schematically illustrated by the second drive voltage $V_{G2S}$ jumping from the off-level $V_{OFF2}$ to the on-level $V_{ON2}$ at a first time t1. For example, t1 is the time when a signal level of the input signal $S_{IN}$ changes from the off-level to the on-level. Just for the purpose of illustration, in FIG. 6, the off-level of the input signal $S_{IN}$ is drawn as a low level and the on-level is drawn as high level. The curve of the second drive voltage $V_{GS2}$ shown in FIG. 6 is an idealistic curve, which is for illustration purposes. In a real circuit there may be delays and a less rapid increase of the second drive voltage $V_{G2S}$. Nevertheless, the second drive voltage $V_{G2S}$ can be increased as fast as possible and with no need to control such increase. The reason for this is as follows: In a conventional transistor device a rapid increase of the gate-source voltage may be critical as such rapid increase may cause rapid changes of the drain-source voltage and a current through the transistor device, respectively. Such rapid changes may cause undesirable electromagnetic interferences (EMI). The transistor device shown in FIGS. 1, 3, and 4 is still in the off-state after the second conducting channel has been generated. Thus generating the second conducting channel does not affect the drain-source voltage or the current through the transistor device. Thus a rapid increase of the second drive voltage $V_{G2S}$ to generate the second conducting channel is not critical in view of EMI.

In a circuit of the type shown in FIG. 5, the drain-source voltage $V_{DS}$ substantially equals the supply voltage V+ when the transistor device is in the off-state. Referring to FIG. 6, the drain-source voltage $V_{DS}$ remains at the level of the supply voltage V+ after the second drive voltage $V_{G2S}$ has reached the on-level $V_{ON2}$. This indicates that the transistor device is still in the off-state after the second conducting channel has been generated.

Generating the first conducting channel in the body region 12 includes changing a voltage level of the first drive voltage $V_{G1S}$ from an off-level $V_{OFF1}$ to an on-level $V_{ON1}$. The off-level $V_{OFF1}$ is such that it prevents the first conducting channel from being generated in the body region 12, and the on-level $V_{ON1}$ is such that it generates the first conducting channel in the body region 12. According to one example, the on-level $V_{ON1}$ of the first drive voltage $V_{G1S}$ equals the on-level $V_{ON2}$ of the second drive voltage $V_{G2S}$, so that $V_{ON1}=V_{ON2}$. According to one example, these voltage levels are selected from a range of between 5 V and 15 V. According to one example, the off-level $V_{OFF1}$ of the first drive voltage $V_{G1S}$, which is referred to as first off-level in the following, is different from the off-level $V_{OFF2}$ of the second drive voltage, is referred to as second off-level in the following. According to one example, the transistor device is a normally-off device, the first off-level $V_{OFF1}$ is substantially zero, and the second off-level $V_{OFF2}$ is negative. According to another example, the transistor device is a normally-on device, and the first off-level $V_{OFF1}$ is also negative. According to one example, the second off-level $V_{OFF2}$ is selected from a range of between 0 V and −15 V, in particular between −1V and −10V.

In FIG. 6, $V_{TH1}$ denotes a threshold voltage associated with the first drive voltage $V_{GS1}$. When the first drive voltage $V_{G1S}$ reaches the level of the threshold $V_{TH1}$, which will be referred to as first threshold $V_{TH1}$ in the following, the first conducting channel is generated in the body region 12. In FIG. 6, t2 denotes a time when the first drive voltage $V_{G1S}$ reaches the first threshold $V_{TH1}$. As the second conducting channel has been generated before the first drive voltage $V_{G1S}$ reaches the first threshold $V_{TH1}$, t2 is the time when the double gate transistor device starts to conduct (switch on). Thus, beginning at the time t2, the drain-source voltage $V_{GS}$ begins to decrease and the load-path voltage $V_Z$ (which is given by the supply voltage V+ minus the drain-source voltage $V_{DS}$) starts to increase. The latter, however, is not shown in FIG. 6.

In the double gate transistor device, the rate at which the drain-source voltage $V_{DS}$ decreases and a current IDS (see FIG. 5) through the transistor device increases is substantially governed by the increase of the first drive voltage $V_{G1S}$ after the first drive voltage $V_{G1S}$ has reached the first threshold $V_{TH1}$. The faster the first drive voltage $V_{G1S}$ increases, the faster the drain-source voltage $V_{DS}$ decreases and the drain-source current IDS increases, respectively. Thus, slopes of transients of the drain-voltage $V_{DS}$ and the drain-source current IDS can be controlled by controlling the increase of the first gate-source voltage $V_{G1S}$.

Unlike a conventional field-effect controlled transistor device the double gate transistor device, when driven in accordance with the drive scheme explained above, exhibits substantially no Miller effect. According to the Miller effect, an increase of the gate-source voltage of a conventional transistor device is delayed after the gate-source voltage reaches the threshold voltage. The reason for this is that there is a parasitic gate-drain capacitance between the gate electrode and the drain node of a conventional field-effect controlled transistor device. In the double-gate transistor device there is corresponding parasitic capacitance between the second gate electrode 31 and the drain node D. This parasitic capacitance can be rapidly charged/discharged via the second gate node G2, as will be explained in further detail herein below. The second gate electrode 31 shields the first gate electrode 21 towards the drain region so that there is only a very small, if any, parasitic capacitance between the first gate electrode 21 and the drain region 14. Thus, there is substantially no Miller effect involved in generating (controlling) the first conducting channel along the first gate dielectric 22. Thus, electrical charge provided to the first gate electrode 21 via the first gate node G1 only serves to generate the first conducting channel in the body region 12 but is not used to charge/discharge parasitic capacitances such as the gate-drain capacitance. By virtue of this, charging/discharging the first gate electrode can be precisely controlled, so that a switching on/switching off behavior of the double gate transistor can be precisely controlled.

In the example shown in FIG. 6, the first drive voltage $V_{G1S}$ and the second drive voltage $V_{G2S}$ start substantially at the time t1. According to another example, shown in FIG. 7, there is a delay time $\Delta t1$ between the time when the second drive voltage $V_{G2S}$ starts to increase and the time when the first drive voltage $V_{G1S}$ starts to increase. For example, a time $t1-\Delta t1$ when the second drive voltage $V_{G2S}$ starts to increase is the time when the input signal changes from the off-level to the on-level. The other explanations provided with regard to FIG. 6 apply to the example shown in FIG. 7 equivalently.

Referring to the explanation above, the second gate electrode 31 is adjacent the body region 12, separated from the body region 12 by the second gate dielectric 32, and configured to control the second conducting channel in the body region 12. The second gate electrode 31 may extend into the drift region 11. In this case, the second gate electrode 31 is dielectrically insulated from the drift region 11 by a dielectric layer 33. A thickness of this dielectric layer 33, which defines a shortest distance between the second gate electrode 31 and the drift region 11, may correspond to the second thickness $d_{32}$ of the second gate dielectric or be greater than the second thickness $d_{32}$. That is, $d_{33} \geq d_{32}$, wherein d 33 denotes the thickness of the further dielectric layer 33. In FIG. 1, $o_{31}$ denotes an overlap between the second gate electrode 31 and the body region 12. This overlap $o_{31}$ defines a length, in the current flow direction, of a section of the second gate electrode 31 that is adjacent the body region 12. When the transistor device is in the off-state and a voltage is applied between the drain node D and the source node S, a space charge region (depletion region) expands in the drift region 11 and the body region 12 beginning at the pn-junction between the drift region 11 and the body region 12. According to one example, a doping concentration of the body region 12 and the overlap $o_{31}$ are designed such that the space charge region in the body region 12 does not extend beyond the second gate electrode 31. That is, the space charge region does not extend farther in the direction of the first surface 101 than the second gate electrode 31. In this case, the transistor device can be switched off by suitably driving the second gate electrode 31, independent of the first drive voltage $V_{G1S}$. For example, the overlap $o_{31}$ is selected from a range of between 0.5 μm and 5 μm, in particular between 1 μm and 3 μm.

In the examples shown in FIGS. 6 and 7 the first drive voltage $V_{G1S}$ is generated to increases substantially linearly beginning at the time t1. This, however, is only an example. According to another example shown in FIG. 8, the first drive voltage $V_{G1S}$ is generated such that it increases non-linearly. For example, the increase is such that it slows down as the level of the first drive voltage $V_{G1S}$ approaches the on-level $V_{ON1}$.

Figure 9:
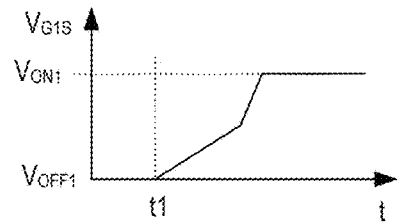
FIG. 9 shows another modification of one of the timing diagrams shown in FIGS. 6 and 7.

According to yet another example, shown in FIG. 9, the increase of the first drive voltage $V_{G1S}$ has two substantially linear sections, a first section beginning at t1, and a second section following the first section. According to one example, the increase in the first section is slower than the second section.

Figure 10:
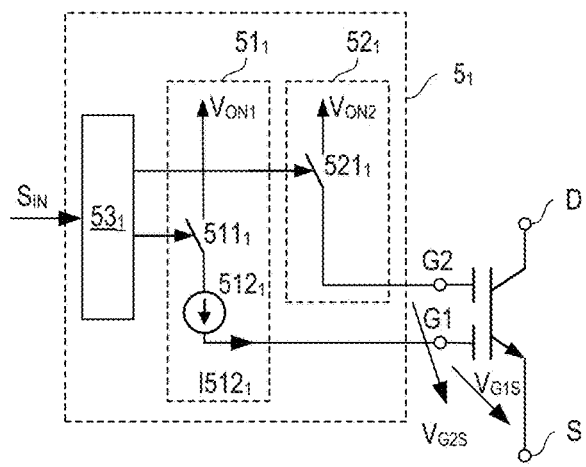
FIG. 10 shows one example of a driver stage configured to switch on a double gate transistor device.

FIG. 10 shows one example of the first driver stage $5_1$ configured to switch on the double gate transistor device. This first driver stage $5_1$ includes a first driver $51_1$ configured to drive the first gate node G1 (generate the first drive voltage $V_{G1S}$ at the first gate node G1) and a second driver $52_1$ configured to drive the second gate node G2 (generate the second drive voltage $V_{G2S}$ at the second gate node G2). A control circuit $53_1$ receives the input signal $S_{IN}$ and controls operation of the first driver $51_1$ and the second driver $52_1$ based on the input signal $S_{IN}$. In the example shown in FIG. 10, the second driver $52_1$ includes a switch $521_1$ coupled between the second gate node G2 and a supply node where a voltage having the second on-level $V_{ON2}$ is available. This voltage is referenced to the source node S. The first driver $51_1$ includes a switch $511_1$ and a current source $512_1$ connected in series with the switch $511_1$. The series circuit with the switch $511_1$ and the current source $512_1$ is connected between the first gate node G1 and a supply node where a voltage having the first on-level $V_{ON1}$ is available. This voltage is also referenced to the source node S.

The first driver stage $5_1$ shown in FIG. 10 is configured to drive the double gate transistor device in accordance with the timing diagrams shown in FIG. 6 or 7. In order to switch on the transistor device, the control circuit $53_1$ based on the input signal $S_{IN}$ closes the switch $521_1$ in the second driver $52_1$ and the switch $511_1$ in the first driver $51_1$. When the switch $521_1$ in the second driver $52_1$ closes, the second drive voltage $V_{G2S}$ rapidly increases to the second on-level $V_{ON2}$ (as shown at times t1 and t1−Δt1 in FIGS. 6 and 7, respectively). When the switch $511_1$ of the first driver $51_1$ closes, the first drive voltage $V_{G1S}$ increases substantially linearly (as shown at times t1 in FIGS. 6 and 7, respectively), wherein a rate of the increase is defined by a current level of a current $512_1$ provided by the current source $512_1$.

According to one example, the control circuit $53_1$ is configured to close the switches $511_1$, $521_1$ at the same time when the input signal $S_{IN}$ indicates that it is desired to switch on the transistor device. In this case, the transistor device switches on in accordance with the timing diagrams shown in FIG. 6. According to another example, the control circuit $53_1$ is configured to first switch on the switch $521_1$ in the second driver $52_1$ and then switch on the switch $511_1$ in the first driver $51_1$. In this case, the transistor device switches on in accordance with the timing diagrams shown in FIG. 7.

The first driver $51_1$ and the second driver $52_1$ can be optimized for different purposes. According to one example, the second driver $52_1$ is optimized to rapidly charge the second gate electrode 31 via the second gate node G2. For this, the second driver $52_1$ may be configured to drive a high current into the second gate node G2. The first driver $51_1$ may be configured to charge the first gate electrode 21 via the first gate node G1 in a predefined fashion. For this, as shown in FIG. 10, the first driver $51_1$ may provide a drive current with a predefined current level. According to one example, this current level is lower than a current level of a maximum drive current provided by the second driver $52_1$. According to one example the currents provided by the first and second drivers $51_1$, $52_1$ become zero when the respective drive voltage $V_{G1S}$, $V_{G2S}$ reaches a predefined voltage level. This is illustrated in FIGS. 6 and 7 in that the drive voltages $V_{G1S}$, $V_{G2S}$ do not further increase when they reach the first on-level VON, and the second on-level $V_{ON2}$, respectively.

Figure 8:
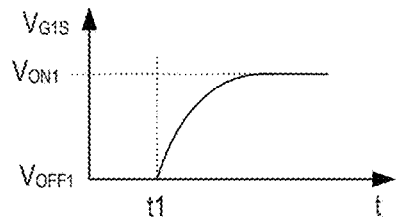
FIG. 8 shows a modification of one of the timing diagrams shown in FIGS. 6 and 7.
Figure 11:
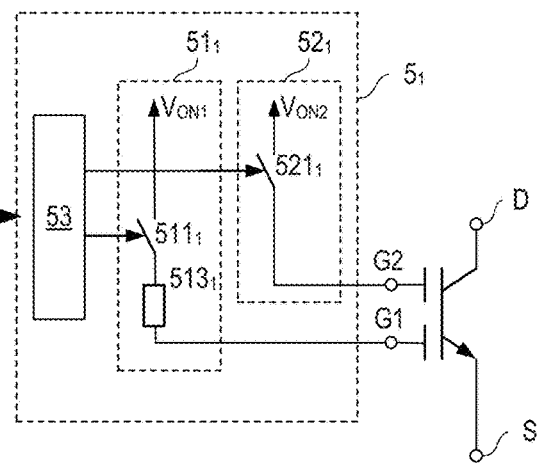
FIG. 11 shows another example of a driver stage configured to switch on a double gate transistor device.

FIG. 11 shows another example of the first driver stage $5_1$. This first driver stage $5_1$ is based on the first driver stage $5_1$ shown in FIG. 10 and is different from the driver stage $5_1$ shown in FIG. 10 in that the first driver $51_1$ includes a resistor $513_1$ instead of the current source $512_1$. Using this first driver stage $5_1$ a behavior of the first drive voltage $V_{G1S}$ as shown in FIG. 8 can be obtained. The control circuit $53_1$, like the control circuit $53_1$ explained with reference to FIG. 10, may switch on the switches $521_1$, $511_1$ in the second driver $52_1$ and the first driver $51_1$, respectively, at the same time or with a time delay $\Delta t1$.

Figure 12:
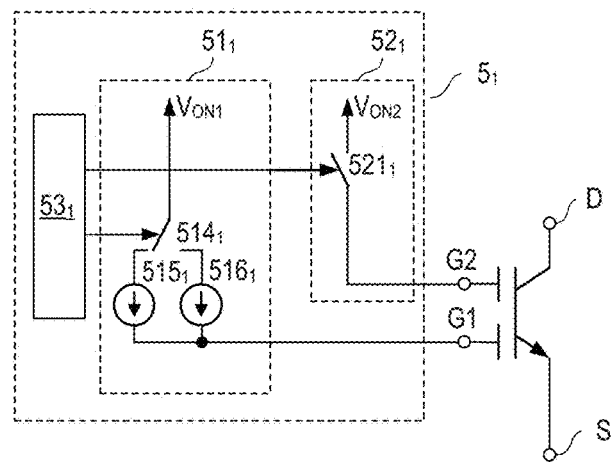
FIG. 12 shows yet another example of a driver stage configured to switch on a double gate transistor device.

FIG. 12 shows another example of the first driver stage $5_1$. This driver stage $5_1$ is based on the driver stage $5_1$ shown in FIG. 10 and is different from the first driver stage $5_1$ shown in FIG. 10 in that the first driver $51_1$ includes a crossover switch $514_1$ instead of an on/off-switch and two current sources $515_1$, $516_1$ instead of only one current source $512_1$. The crossover switch $514_1$ is controlled by the control circuit $53_1$ and can have three different switching positions, a first position, in which the crossover switch $514_1$ connects the first current source $515_1$ between the supply node and the first gate node G1; a second position, in which the crossover switch $514_1$ connects the second current source $516_1$ between the supply node and the first gate node G1; and a third position, in which none of the current sources $515_1$, $516_1$ is connected between the supply node and the first gate node G1.

Using the first driver stage $5_1$ shown in FIG. 12 a behavior of the first drive voltage $V_{G1S}$ as shown in FIG. 9 can be obtained. When the transistor device is in the off-state, the crossover switch $514_1$ couples none of the current source $515_1$, $516_1$ to the first gate node G1. When the transistor device is to be switched on, the crossover switch $514_1$, controlled by the control circuit $53_1$, connects the first current source $515_1$ to the first gate node G1 at time t1, in order to obtain a first increase of the first drive voltage $V_{G1S}$. After a delay time, the crossover switch $514_1$ switches over to connect the current source $516_1$ to the first gate node G1, in order to obtain the second increase of the first drive voltage $V_{G1S}$. A current provided by the second current source $516_1$ can be higher than a current provided by the first current source $515_1$ in order to obtain a timing diagram as shown in FIG. 9.

As an alternative to providing a crossover switch $514_1$ a respective switch (not shown) can be connected in series with each of the current sources $515_1$, $516_1$. These switches can be controlled by the control circuit $53_1$. In this example, the slower increase of the first drive voltage $V_{G1S}$ can be obtained by switching on only one of the switches, and the faster increase can be obtained by switching on both of the switches.

Figure 13:
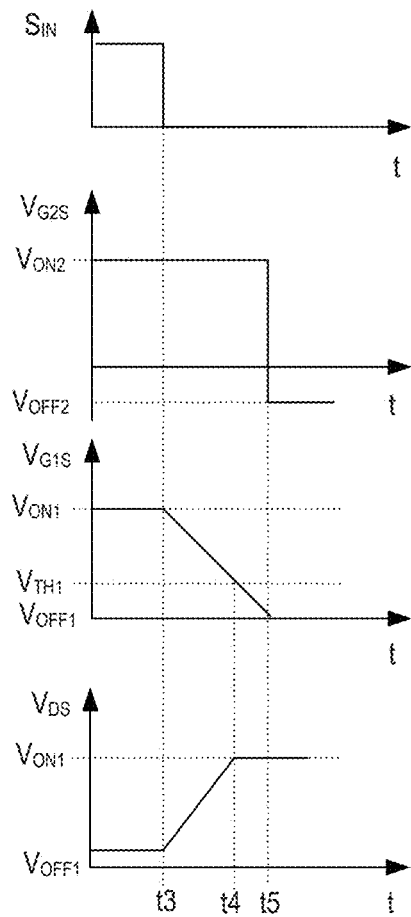
FIG. 13 shows timing diagrams that illustrate one example of how a double gate transistor device can be switched off.

FIG. 13 shows timing diagrams of an example of how the double gate transistor device can be switched from the on-state to the off-state. In particular, FIG. 13 shows timing diagrams of the input signal $S_{IN}$, the first drive voltage $V_{G1S}$, the second drive voltage $V_{G2S}$, and the drain-source voltage $V_{DS}$.

Referring to the explanation above, the transistor device is in the on-state when there is the first conducting channel along the first gate dielectric 22 and the second conducting channel along the second gate dielectric 32. Switching off the transistor device includes interrupting the first conducting channel before interrupting the second conducting channel. Interrupting the first conducting channel includes decreasing the first drive voltage $V_{G1S}$ from the first on-level $V_{ON1}$ to the first off-level $V_{OFF1}$. In the example shown in FIG. 13, a switching-off procedure of the transistor device starts at time t3 when the first drive voltage $V_{G1S}$ starts to decrease. According to one example, this time t3 is defined by the input signal $S_{IN}$ and may be the time when the signal level of the input signal $S_{IN}$ changes from the on-level to the off-level (whereas, for the purpose of illustration, propagation delays in the drive circuit 5 are neglected in the signal diagrams shown in FIG. 13).

As the first drive voltage $V_{G1S}$ decreases, the drain-source voltage $V_{DS}$ increases. There may be a time delay between the time t3 when the first drive voltage $V_{G1S}$ starts to decrease and the time when the drain-source voltage $V_{DS}$ starts to increase. However, such delay, which may result from discharging excessive charge from the first gate electrode 21, is not shown in FIG. 13. The first conducting channel is interrupted, and the drain-source voltage $V_{DS}$ reaches its maximum not before the first drive voltage $V_{G1S}$ falls below the first threshold $V_{TH1}$, which is shown at time t4 in FIG. 13. There may be a time delay between the time t4 when the first drive voltage $V_{G1S}$ falls below the first threshold $V_{TH1}$ and the time when the drain-source voltage $V_{DS}$ reaches its maximum. However, such time delay is not shown in FIG. 13. At a later time t5 the first drive voltage $V_{G1S}$ reaches the first off-level $V_{OFF1}$. In the example shown in FIG. 13, the first drive voltage $V_{G1S}$ decreases substantially linearly. This, however, is only an example. According to another example shown in FIG. 15, the first drive voltage $V_{G1S}$ decreases non-linearly. In particular, the first drive voltage $V_{G1S}$ may decrease slower as the first drive voltage $V_{G1S}$ approaches the first off-level $V_{OFF1}$. According to another example shown in FIG. 16, the first drive voltage $V_{G1S}$ decreases in two timely subsequent non-linear sections.

Interrupting the second conducting channel includes decreasing the second drive voltage $V_{G2S}$ from the second on-level $V_{ON2}$ to the second off-level $V_{OFF2}$. In the example shown in FIG. 13, the decrease begins at time t5, which is when the first drive voltage $V_{G1S}$ reaches the first off-level $V_{OFF1}$. According to another example, shown in FIG. 14, there is a delay time $\Delta t5$ between the time t5 when the first drive voltage $V_{G1S}$ reaches the first off-level $V_{OFF1}$ and the time when the second drive voltage $V_{G2S}$ starts to decrease.

It should be noted that although switching off the transistor device as explained with reference to FIGS. 13 and 14 includes interrupting both the first conducting channel and the second conducting channel, the transistor device is already off (non-conducting) at time t4 when the first conducting channel is interrupted. Like in the switching-on procedure explained before, the rate at which the drain-source voltage $V_{DS}$ changes its voltage level is controlled by the rate at which the first drive voltage $V_{G1S}$ changes its voltage level. Changing the first drive voltage $V_{G1S}$, that is, discharging the first gate electrode 21, is not associated with discharging/charging significant parasitic capacitances so that there is at most a weak Miller effect involved in switching off the transistor device.

Figure 17:
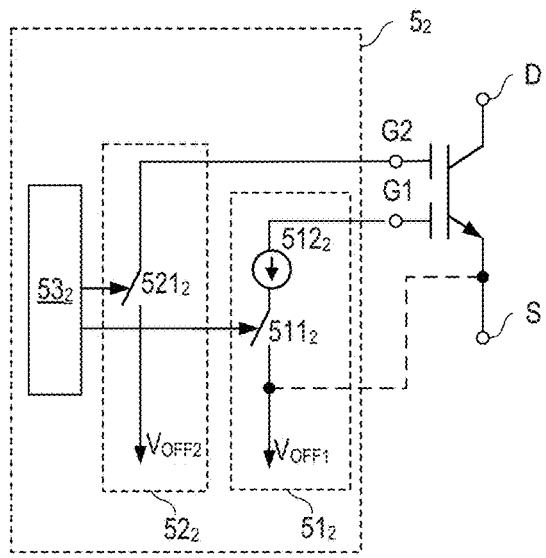
FIG. 17 shows one example of a driver stage configured to switch off a double gate transistor device.

FIG. 17 shows one example of a second driver stage $5_2$ configured to switch off the transistor device. This second driver stage $5_2$ includes a first driver $51_2$ configured to drive the first gate node G1, and a second driver $52_2$ configured to drive the second gate node G2. In this example, the second driver $52_2$ includes a switch $521_2$ connected between the second gate node G2 and a supply node where a voltage having the second off-level $V_{OFF2}$ is available. The first driver $51_2$ includes a series circuit with a switch $511_2$ and a current source $512_2$, wherein the series circuit with the switch $511_2$ and the current source $512_2$ is connected between the first gate node G1 and a supply node where a supply voltage having the first off-level $V_{OFF1}$ is available. According to one example, the first off-level $V_{OFF1}$ is zero. In this case, the supply node equals the source node S. This is illustrated in dashed lines in FIG. 17.

The first driver $51_2$ and the second driver $52_2$ can be optimized for different purposes. According to one example, the second driver $52_2$ is optimized to rapidly discharge the second gate electrode 31 via the second gate node G2. For this, the second driver $52_2$ may be configured to draw a high current from the second gate node G2. The first driver $51_2$ may be configured to discharge the first gate electrode 21 via the first gate node G1 in a predefined fashion. For this, as shown in FIG. 17, the first driver $51_2$ may draw a drive current with a predefined current level from the first gate node G1. According to one example, this current level is lower than a current level of a maximum drive current drawn by the second driver $52_2$. According to one example the currents provided by the first and second drivers $51_2$, $52_2$ become zero when the respective drive voltage $V_{G1S}$, $V_{G2S}$ reaches a predefined voltage level. This is illustrated in FIGS. 13 and 14 in that the drive voltages $V_{G1S}$, $V_{G2S}$ do not further decrease when they reach the first off-level $V_{OFF1}$ and the second off-level $V_{OFF2}$, respectively.

Figure 14:
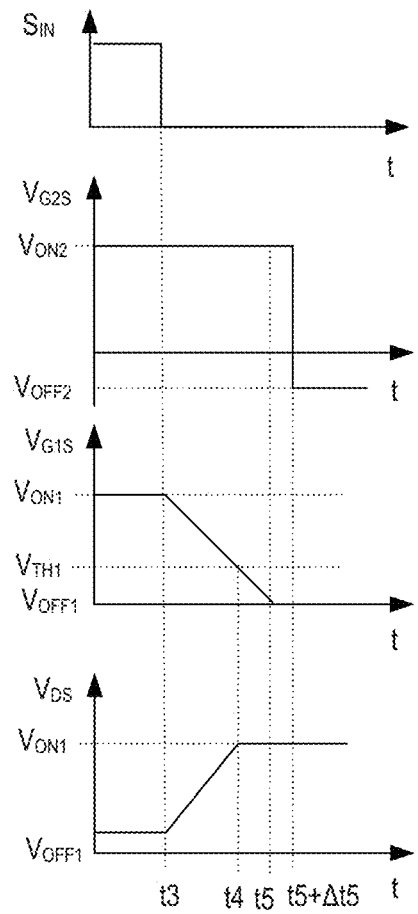
FIG. 14 shows timing diagrams that illustrate another example of how a double gate transistor device can be switched off.

The second driver stage $5_2$ shown in FIG. 17 is configured to switch off the transistor device in accordance with the timing diagrams shown in FIG. 13 or FIG. 14. When the input signal $S_{IN}$ indicates that it is desired to switch off the transistor device, a control circuit $53_2$ switches on the switch $511_2$ in the first driver $51_2$ in order to decrease the first drive voltage $V_{G1S}$ to the first off-level $V_{OFF1}$. In the first driver $51_2$ shown in FIG. 17 the current source $511_2$ causes the first gate electrode 21 to be discharged so that the first drive voltage $V_{G1S}$ decreases substantially linearly. After the first conducting channel has been interrupted, the control circuit $53_2$ switches on the switch $521_2$ in the second driver $52_2$ in order to decrease the second drive voltage $V_{G2S}$ to the second off-level $V_{OFF2}$. The control circuit $53_2$ can be configured to close the switch $521_2$ when the first drive voltage $V_{G1S}$ has reached the first off-level $V_{OFF1}$. In this case, the transistor device switches off in accordance with the timing diagrams shown in FIG. 13. The control circuit $53_2$ could also be configured to close the switch $521_2$ after a delay time $\Delta t5$. In this case, the transistor device switches off in accordance with the timing diagrams shown in FIG. 14. In both examples, the control circuit $53_2$ can be configured to detect a voltage level of the first drive voltage $V_{G1S}$ and start discharging the second gate electrode 31 upon detecting or after a certain delay time $\Delta t5$ after detecting that the first drive voltage $V_{G1S}$ has reached a predefined threshold, such as the first off-level $V_{OFF1}$.

According to another example, the control circuit $53_2$ discharges the first and second gate electrodes 21, 31, that is, drives the switches $511_2$, $521_2$, in accordance with a predefined time scheme. For example, the control circuit $53_2$ starts to discharge the first gate electrode 21 by closing switch $511_2$ at one time and starts to discharge the second gate electrode 31 by closing switch $521_2$ a fixed time period afterwards. This time period is selected such that the second channel has been interrupted at the time at which discharging the first electrode 21 starts.

Figure 15:
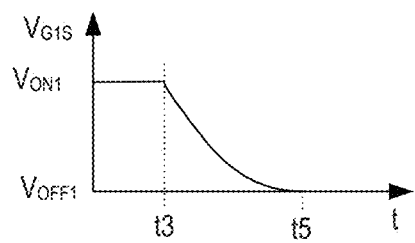
FIG. 15 shows a modification of one of the timing diagrams shown in FIGS. 13 and 14.
Figure 16:
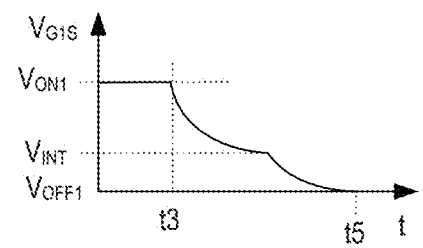
FIG. 16 shows another modification of one of the timing diagrams shown in FIGS. 13 and 14.
Figure 18:
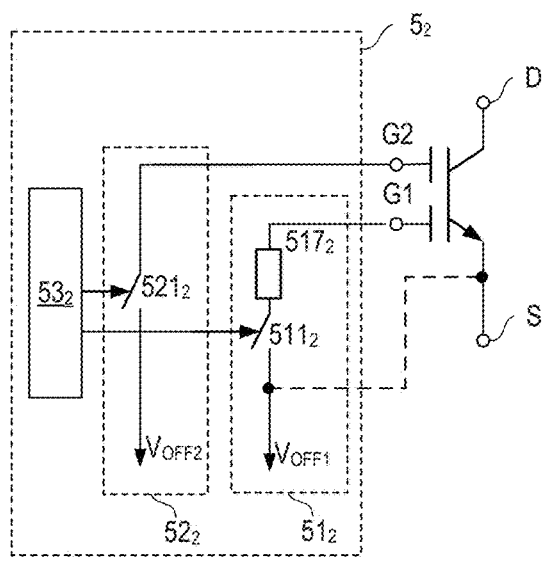
FIG. 18 shows another example of a driver stage configured to switch off a double gate transistor device.

FIG. 18 shows another example of the second driver stage $5_2$. This second driver stage $5_2$ is based on the second driver stage $5_2$ shown in FIG. 17 and is different from the second driver stage $5_2$ shown in FIG. 17 in that the first driver $51_2$ includes a resistor $517_2$ instead of the current source $512_2$. Using this second driver stage $5_2$ a decrease of the first drive voltage $G1_S$ as shown in FIG. 15 can be obtained.

Figure 19:
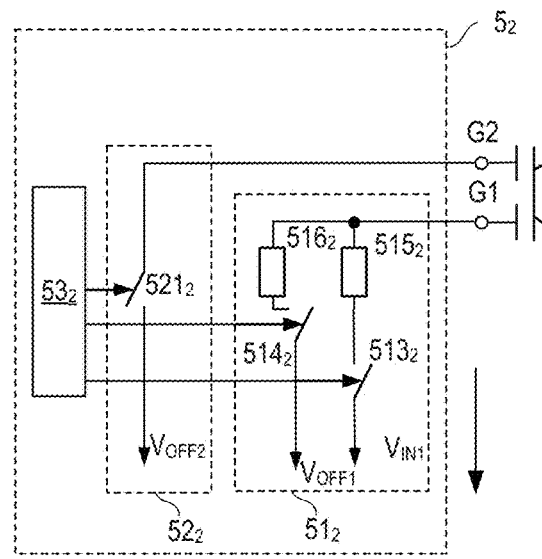
FIG. 19 shows yet another example of a driver stage configured to switch off a double gate transistor device.

FIG. 19 shows another example of the second driver stage $5_2$. This second driver stage $5_2$ is based on the second driver stage $5_2$ shown in FIG. 17 and is different from the second driver stage $5_2$ shown in FIG. 17 in that the first driver $51_2$ includes two series circuits each including a respective switch $513_2$, $514_2$ and a respective resistor $515_2$, $516_2$. Both switches $513_2$, $514_2$ are controlled by the control circuit $53_2$. A first series circuit with the switch $513_2$ and the resistor $515_2$ is connected between the first gate node G1 and a supply node where an intermediate voltage $V_{INT}$ is available. The level of this intermediate voltage $V_{INT}$ is between the first on-level $V_{ON1}$ and the first off-level $V_{OFF1}$. A second series circuit with the switch $514_2$ and the resistor $516_2$ is connected between the first gate node G1 and the supply node where a voltage with the first off-level $V_{OFF1}$ is available. In this second driver stage $5_2$, the control circuit $53_2$ is configured to switch on the switch $513_2$ in the first series circuit when the input signal $S_{IN}$ indicates that is desired to switch off the transistor device. By this, the first drive voltage $V_{G1S}$ decreases to the intermediate level $V_{INT}$. The control circuit $53_2$ then switches off the switch $513_2$ and switches on the switch $514_2$ in the second series circuit. By this, the voltage level of the first drive voltage $V_{G1S}$ decreases to the first off-level $V_{OFF1}$. This is in accordance with the timing diagram shown in FIG. 16.

According to another example (not shown), the first driver $51_2$ includes a first current source instead of the resistor $515_2$ in the first series circuit and a second current source instead of the resistor $516_2$ in the second series circuit. In this case, the first drive voltage $V_{G1S}$ decreases substantially linearly between the first on-level \Tom and the intermediate level $V_{INT}$ and between the intermediate level $V_{INT}$ and the first off-level $V_{OFF1}$.

According to another example (not shown), the first driver $51_2$ includes a circuit configured to provide two different current levels. For example, this circuit may include two current sources or an adjustable current source). By suitably timing when these current sources are activated and deactivated the first gate electrode 21 can be discharged in a predefined fashion.

In the examples explained above, the second driver $52_1$, $52_2$ in the first driver $5_1$ and the second driver stage $5_2$, respectively, is drawn to merely include a switch $521_1$, $521_2$ connected to the second gate node G2. This, however, is only an example. The second driver $52_1$, $52_2$ may additionally include a current source and/or a resistor. Nevertheless, the second driver $52_1$, $52_2$ is designed such that it charges/discharges the second gate electrode 31 faster than the respective first driver $51_1$, $51_2$ charges/discharges the first gate electrode 21. For example, "faster" means that a maximum absolute value of a time derivative $dV_{G1S}/dt$ of the first drive voltage $V_{G1S}$ in the charging/discharging process is lower than a maximum absolute value of a time derivative $dV_{G2S}/dt$ of the second drive voltage $V_{G2S}$ in the charging/discharging process. According to another example, "faster" means that an average charging/discharging current of the first gate electrode 21 is lower than an average charging/discharging current of the second gate electrode 31.

Figure 20:
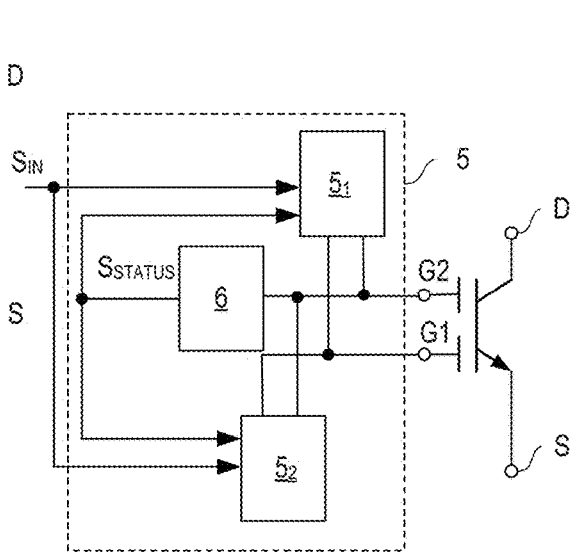
FIG. 20 shows one example of a driver that includes a first driver stage, a second driver stage and a detection circuit.

FIG. 20 shows a drive circuit 5 according to another example. This drive circuit includes a detection circuit 6 besides the first driver stage $5_1$ and the second driver stage $5_2$. The first driver stage $5_1$ and the second driver stage $5_2$ can be implemented in accordance with one of the examples explained before. The detection circuit 6 is connected to the second gate node G2 and is configured to detect a time when the first conducting channel has been generated or has been interrupted. That is, the detection circuit 6 is configured to detect when the first drive voltage $V_{G1S}$ rises above the first threshold $V_{TH1}$ or falls below the first threshold $V_{TH1}$. According to one example, the detection circuit 6 outputs a status signal $S_{STATUS}$ that indicates when the first conducting channel has been generated or has been interrupted. For example, when the transistor device switches off and the detection circuit 6 detects that the first conducting channel has been interrupted, the control circuit $53_2$ in the second driver stage $5_2$ based on the status signal $S_{STATUS}$ may control the second driver $52_2$ to interrupt the second conducting channel as soon as the status signal $S_{STATUS}$ indicates that the first conducting channel has been interrupted.

FIG. 21 shows one example of the detection circuit 6 configured to detect when the first conducting channel has been generated after the second conducting channel has been generated. This detection circuit 6 can be activated and deactivated by a control circuit 7. The control circuit 7 receives the input signal $S_{IN}$ and is further configured to activate or deactivate the second driver $52_1$ in the first driver stage $5_1$. Deactivating the second driver $52_1$ may include disconnecting the second gate node G2 from the supply node. This is explained with reference to FIG. 22 below.

FIG. 22 shows timing diagrams of the input signal $S_{IN}$, a drive signal $S521_1$ of the switch $521_1$ (see, e.g., FIGS. 10-12) in the second driver $52_1$, the second drive voltage $V_{GS2}$ and an enable signal S62 (which may also be referred to as activation signal) of the detection circuit 6. The drive signal 55211 activates or deactivates the second driver $52_1$, whereas the second driver $52_1$ is active when the drive signal $S521_1$ switches on the switch $521_1$ and inactive when the drive signal $S521_1$ switches off the switch $521_1$. Just for the purpose of illustration a signal level of the drive signal $S521_1$ that activates the second driver $52_1$ is drawn as a high level in FIG. 22. Equivalently, the enable signal S62 enables or disables (activates or deactivates) the detection circuit. Just for the purpose of illustration a signal level of the enable signal S62 that activates the detection circuit is drawn as a high level in FIG. 22. The second driver $51_2$ in the first driver stage is activated/deactivated based on a first control signal $S7_1$ provided by the control circuit 7 to the first driver stage $5_1$.

Referring to the signal diagrams shown in FIG. 22, the control circuit 7 is configured to activate the second driver $52_1$ in the first driver stage $5_1$ for an activation period T521 when the input signal $S_{IN}$ by changing from the off-level to the on-level indicates that it is desired to switch on the transistor device. According to one example, a duration of the time period T521 is selected long enough for the second drive signal $V_{G2S}$ to reach the second on-level $V_{ON2}$, that is, long enough for the second conducting channel to be generated, and short enough that the transistor device is still in the off-state at the end of this time period T521 (that is, for the first conducting channel to be interrupted). After the activation period, the control circuit 7 deactivates the second driver $52_1$ in the first driver stage $5_1$ and activates the detection circuit 6.

Referring to FIG. 21, the detection circuit 6 may include a voltage regulator 61 configured to regulate the second drive voltage $V_{G2S}$ such that it remains on the second on-level $V_{ON2}$. For this, the voltage regulator receives the second drive voltage $V_{G2S}$ (or a signal indicating the second drive voltage $V_{G2S}$) and a voltage that has the second on-level $V_{ON2}$. The detection circuit 6 can be activated/deactivated by the enable signal S62. Activating/deactivating the detection circuit 6 may include closing/opening a switch 62 coupled between an output of the voltage regulator 61 and the second gate node G2 and driven by the enable signal S62. It should be noted, however, that providing a switch between the output of the voltage regulator 61 and the second gate node is only one of several possible means to activate/deactivate the voltage regulator 62 by the enable signal S62; other means may be used as well.

Furthermore a current measurement and filter circuit 63 is connected between the voltage regulator and the second gate node G2. The current measurement and filter circuit 63 is configured to measure a current flowing between the voltage regulator 61 and the second gate node G2 to generate a current measurement signal and to filter this current measurement signal. An output signal S63 of the current measurement and filter circuit 63 represents the filtered current measurement signal. For example, filtering the current measurement signal includes integrating the current measurement signal or differentiating the current measurement signal. By integrating the current measurement signal a change of an electrical charge stored in the second gate electrode 31 can be monitored, and by differentiating the current measurement signal a rapid increase or decrease of a current flowing to or from the second gate electrode 31 can be monitored. However, integrating or differentiating are only two examples of how the current measurement signal can be filtered, other filter methods can be used as well.

According to one example, the current measurement and filter circuit 63 receives the enable signal S62 and is reset after the enable signal S62 has disabled the detection circuit 6 and before the enable signal S62 again activates the detection circuit 6. By this, the output signal S63 of the current measurement and filter circuit 63 represents the current filtered in a time period that begins when the detection circuit 6 is enabled (activated). In this case, if filtering the current measurement includes integrating the current measurement signal, the output signal S63 represents an amount of electrical charge provided from the voltage regulator 61 to the second gate node G2 (or received by the voltage regulator 61 from the second gate node G2) in a time period after the detection circuit 6 has been enabled, that is, after the second gate electrode has already been charged to the on-level $V_{ON2}$ by the second driver $52_1$ in the first driver stage $5_1$.

An evaluation circuit 64 receives the output signal S63 of the current measurement and filter circuit 63 and generates the status signal $S_{STATUS}$ based on the output signal. According to one example, the evaluation circuit 64 generates the status signal based on comparing the output signal S63 with a threshold. According to one example, the evaluation circuit 64 generates a signal level of the status signal $S_{STATUS}$ indicating that the first conducting channel has been generated when the output signal S63 (representing the filtered current measurement signal) reaches a predefined threshold.

Why measuring the current provided by the voltage regulator to the second gate electrode is suitable to detect whether the first conducting channel has been generated is explained below with reference to FIGS. 22 and 23. FIG. 23 shows an equivalent circuit diagram of a double gate transistor device. This equivalent circuit diagram shows parasitic capacitances of the double gate transistor device and how they are connected. Referring to FIG. 23, the double gate transistor device includes a first capacitance $C_{G1S}$ between the first gate node G1 and the source node S1, a second capacitance $C_{G1G2}$ between the first gate node G1 and the second gate node G2, a third capacitance $C_{G2D}$ between the second gate node G2 and the drain node D, and a fourth capacitance between the drain node D and the source node S. In the following, the first capacitance $C_{G1S}$ is also referred to as gate-source capacitance, the second capacitance $C_{G1G2}$ is also referred to as gate-gate capacitance, the third capacitance $C_{G2D}$ is also referred to as gate-drain capacitance, and the fourth capacitance $C_{DS}$ is also referred to as drain-source capacitance.

The following explanation starts at the end of the time period T521. Referring to the above, at the end of this time period the second drive voltage $V_{G2S}$ has reached the second on-level $V_{ON2}$, the transistor device is still in the off-state (that is, the first drive voltage $V_{G1S}$ is below the first threshold voltage $V_{TH1}$), and the detection circuit 6 is enabled. A voltage across the drain-source capacitance $C_{DS}$ may correspond to the supply voltage V+ (see, FIG. 5) at the end of the time period T521. When the first drive voltage $V_{G1S}$ reaches the first threshold voltage $V_{TH1}$ the transistor device starts to conduct. At this time, the drain source capacitance CDs starts to be discharged; the electrical potential at the drain node D starts to decrease when a current through the transistor has reached its maximum current level. The drain node D is capacitively coupled to the second gate node G2 via the gate-drain capacitance $C_{G2D}$ so that a decreasing potential at the drain node D would decrease the electrical potential at the second gate node G2 unless this electrical potential at the second gate node G2 is tied to a fixed potential (such as in the examples shown in FIGS. 10-12, where the second gate node G2 is tied to $V_{ON2}$) or regulated. In the detection circuit 6 shown in FIG. 21, after the time period T521, the voltage regulator 61 regulates the electrical potential at the second gate node G2 such that the drive voltage $V_{G2S}$ substantially remains at $V_{ON2}$. This regulation requires discharging the gate-drain capacitance $C_{G2D}$ after the transistor device switches on, whereas discharging the gate-drain capacitance $C_{G2D}$ requires the voltage regulator 61 to drive a current I6 into the second gate node G2.

Figure 24:
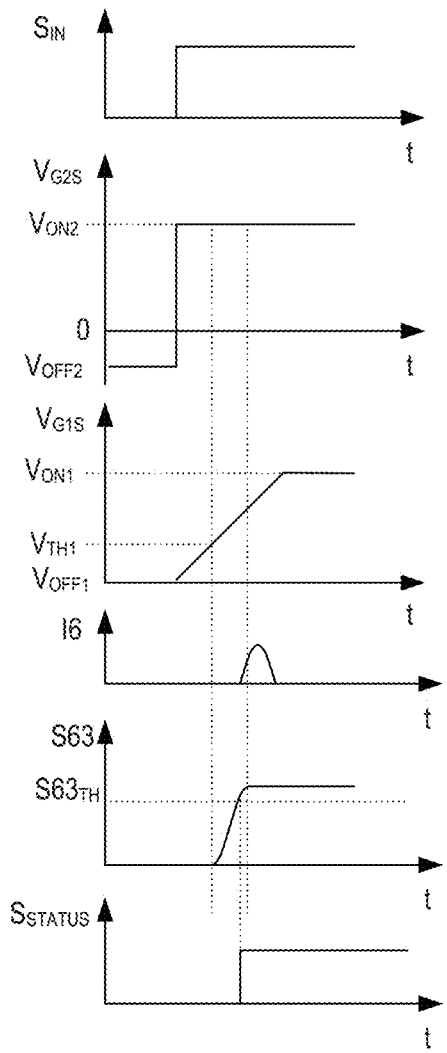
FIGS. 24 and 25 show signal diagrams illustrating one way of operation of the detection circuit shown in FIG. 22.

This is illustrated in FIG. 24, where signal diagrams of the input signal $S_{IN}$, the second drive voltage $V_{G2S}$, the first drive signal $V_{GS1}$, the current I6 from the voltage regulator to the second gate node G2, the measurement and filter signal S63, and the status signal $S_{STATUS}$ are shown. For the purpose of explanation it is assumed that the current I6 starts to flow when the first drive voltage $V_{GS1}$ reaches the first threshold $V_{TH1}$. The current measurement and filter circuit 63 measures the current I6 to generate a current measurement signal and filter this current measurement signal.

According to one example, filtering the current measurement signal includes integrating the current measurement signal, so that the measurement and filter signal S63 represents a change of the charging state of the gate drain capacitance $C_{G2D}$. According to one example, the measurement and filter signal S63 is proportional to an integral of the current I6. It can be assumed that the transistor device has changed its operation state when a certain amount of charge has been provided to the second gate electrode 31, that is, when the measurement and filter signal S63 has reached a predefined threshold $S63_{TH}$ so that the evaluation circuit 64 changes a signal level of the status signal $S_{STATUS}$ (asserts the status signal $S_{STATUS}$) to indicate that the transistor device has switched on when the measurement and filter signal S63 has reached the predefined threshold $S63_{TH}$.

Figure 25:
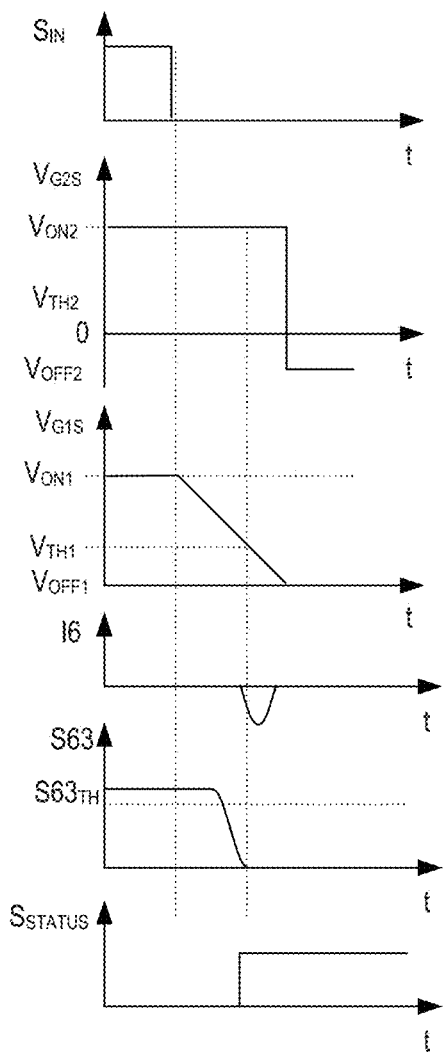

According to one example, the detection circuit 6 is not only configured to detect when the transistor device switches from the off-state to the on-state (when the first conducting channel has been generated after the second conducting channel has been generated), but may also detect when the transistor device switches from the on-state to the off-state (when the first conducting channel has been interrupted before the second conducting channel is interrupted). Referring to the above, when the device switches on, the second gate electrode 31 changes its charging state when the first conducting channel is generated. This change of the charging state is associated with a charging current that can be monitored by the measurement and filter circuit. When the transistor device switches off by first interrupting the first conducting channel and then interrupting the second conducting channel, as explained with reference to FIGS. 13 and 14, the change of the charging state of the second gate electrode is reversed. That is, a current flows from the second gate electrode 31 and the second gate node G2, respectively, to the voltage regulator and can be measured by the measurement and filter circuit 63. According to one example, the detection circuit 6 stays activated throughout the on-state of the transistor device and the evaluation circuit 64 sets the status signal $S_{STATUS}$ to a signal level indicating that the first conducting channel has been interrupted when the output signal S63 of the measurement and filter circuit falls below the predefined threshold. This is illustrated in FIG. 25 where signal diagrams of the same signals as in FIG. 24 are shown during switching off.

According to another example (not shown), the measurement and filter circuit 63 is reset after the status signal $S_{STATUS}$ has indicated that the transistor device has been switched on so that the measurement and filter signal S63 becomes zero. In this case, the measurement and filter signal S63 is compared with a second threshold during turn-off, and the status signal $S_{STATUS}$ is set back to the signal level indicating that the transistor device has been switched off when the measurement and filter signal S63 falls below the second threshold.

According to one example, the first gate electrode 21 is driven based on the status signal. For this, at least one of the first driver stage $5_1$ and the second driver stage $5_2$ receives the status signal $S_{STATUS}$. According to one example, a time scheme of driving the first gate electrode 21 is dependent on the status signal $S_{STATUS}$. For example, if the first gate electrode 21 is driven in accordance with the drive scheme shown in FIG. 9 where the drive current changes from a first current level (defined by current source $515_1$ shown in FIG. 12) to a second current level (defined by current source $516_1$ shown in FIG. 12) the time of changing the current level can be dependent on the status signal. That is, the first gate electrode 21 may be driven (charged) based on the first current level until the status signal $S_{STATUS}$ indicates that the first conducting channel has been generated, and based on the second current level afterwards. Equivalently, when the transistor device switches off the first gate electrode may be driven (discharged) based on a first current level until the status signal $S_{STATUS}$ indicates that the first conducting channel has been interrupted, and based on a second current level afterwards. It should be noted that the first current level when driving the first gate electrode 21 to generate the first conducting channel can be different from the first current level when driving the first gate electrode 21 to interrupt the first conducting channel, and the second current level when driving the first gate electrode 21 to generate the first conducting channel can be different from the second current level when driving the first gate electrode 21 to interrupt the first conducting channel. In general, the first gate electrode can be driven based on a first drive parameter until the status signal $S_{STATUS}$ indicates that an operation state of the transistor device has changed, and based on a second drive parameter afterwards.

The operation state of the transistor device changes each time the first conducting channel is either generated or interrupted. In the example explained above, the first drive parameter is a first current level of the drive current, and a second drive parameter is a second current level of the drive current. However, the first and second drive parameters are not restricted to be current levels. According to another example, the first and second drive parameters include a resistance coupled to the first gate node G1, so that a first resistance can be connected between the first gate node G1 and a supply node until the status signal $S_{STATUS}$ indicates that the operation status has changed and a second resistance can be connected between the first gate node G1 and a supply node after the status signal $S_{STATUS}$ has indicated indicates that the operation status has changed. According to yet another example, the supply potential applied to the first gate electrode G1 may change based on the status signal $S_{STATUS}$. The first and second drive parameters could even be combinations of the above. For example, a first supply potential may be applied to the first gate node G1 via a first resistor (such as $V_{INT}$ via resistor $515_2$ in the first drive circuit $51_2$ shown in FIG. 19), and first second potential may be applied to the first gate node G1 via a second resistor (such as $V_{OFF1}$ via resistor $516_2$ in the first drive circuit $51_2$ shown in FIG. 19).

According to another example, the detection circuit 6 is used to diagnose the transistor device before it is switched on. Referring to the above, the first gate electrode 21 and the second gate electrode 31 are capacitively coupled. Thus, if the transistor device has been properly connected in an application circuit, such as an application circuit illustrated in FIG. 5, and the transistor device is faultless changing the electrical potential at the first gate node G1 is supposed to either change the electrical potential at the second gate node G2 or cause a capacitive displacement current to flow from or into the second gate node. The electrical potential of the second gate node G2 changes if the second gate node G2 is floating during the diagnosis, that is, not clamped to a fixed potential. A capacitive displacement current flows if the electrical potential at the second node is clamped to a fixed potential, such as the second off-level, during the diagnosis. Thus, diagnosing the device may include changing the electrical potential at the first gate node G1, for example, from the first off-level $V_{OFF1}$ to the first on-level $V_{ON1}$ and monitoring the second gate node G2. According to one example, the transistor device is considered to be faultless and properly connected if the electrical potential at the second gate node G2 changes or a capacitive displacement current is detected. Additionally or alternatively, diagnosing the transistor device may include changing the electrical potential at the second gate node G2 and monitoring the first gate node G1.

During the diagnosis the transistor device is in the off-state so that potential faults can be detected before the transistor device is switched on for the first time.

Figure 26:
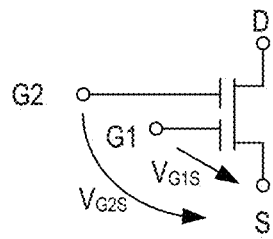
FIG. 26 shows the circuit symbol of a double gate transistor implemented as a HEMT (High Electron Mobility Transistor)

In the examples explained above the transistor device is a field-effect controlled transistor device, in particular an MOS transistor, such as a MOSFET or an IGBT. The method explained above for driving a transistor device with two gate electrodes and two gate nodes G1, G2, however, is not restricted to this specific type of transistor device, but may be used for driving any other type of transistor device such as, for example, a HEMT or a GIT as well. Just for the purpose of illustration a circuit symbol of a HEMT with two gate electrodes G1, G2 is shown in FIG. 26. Like in each of the transistor devices explained before, a first drive voltage $V_{G1S}$ of the HEMT is a voltage between a first gate node G1 and a source node and a second drive voltage $V_{G1S}$ of the HEMT is a voltage between a second gate node G2 and the source node S. The same applies to a GIT.

Driving a HEMT or GIT in accordance with the method explained above includes one of switching on and off the HEMT or GIT. Switching on includes generating a first conducting channel by driving a first gate electrode coupled to the first gate node and, before generating the first conducting channel, generating a second conducting channel by driving a second gate electrode coupled to the second gate node. The second conducting channel may be switched on faster than the first conducting channel. Switching off includes interrupting a first conducting channel by driving a first gate electrode and, after interrupting the first conducting channel, interrupting a second conducting channel by driving a second gate electrode. The second conducting channel may be interrupted faster than the first conducting channel. The voltage levels of the first and second drive voltages $V_{G1S}$, $V_{G2S}$ required to generate or interrupt the first and second conducting channels are dependent on the specific type of HEMT or GIT. Some examples are explained below.

Figure 27:
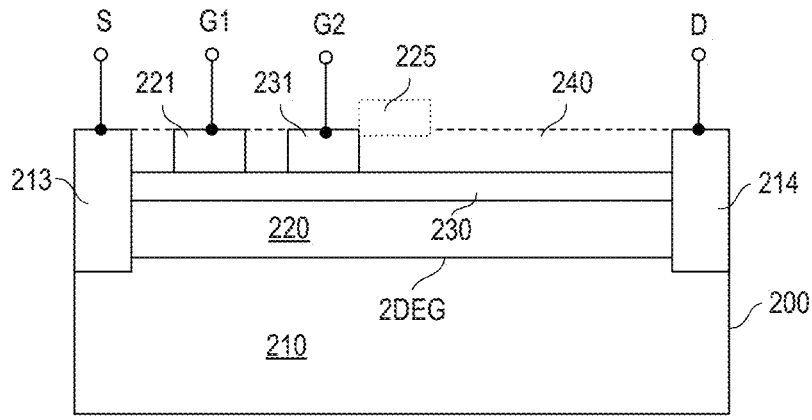
FIG. 27 shows a vertical cross sectional view of a HEMT according to one example.

FIG. 27 shows a vertical sectional view of a HEMT according to one example. The HEMT includes a semiconductor body 200 with a first semiconductor layer 210 and a second semiconductor layer 220 adjoining the first semiconductor layer 210. According to one example, the first semiconductor layer 210 includes a group III nitride of a first type, and the second semiconductor layer 220 includes a group III nitride of a second type different from the first type. The first and second type group III nitrides are chosen such that there is a two-dimensional electron gas (2DEG) in at least one of the first and second semiconductor layers 210, 220 in a region close to an interface between the first and second semiconductor layers 210, 220. Referring to FIG. 27, a source electrode 213 is connected to the first semiconductor layer 210 and the second semiconductor layer 220. This source electrode 213 is connected to a source node S or forms a source node S of the transistor device. A drain electrode 214 is connected to a drain node D or forms a drain node D of the transistor device. The drain electrode 214 is electrically connected to the first semiconductor layer 210 and the second semiconductor layer 220 and is spaced apart from the source electrode 213 in a current flow direction of the transistor device. In the example shown in FIG. 27, the current flow direction is a direction parallel to the 2DEG. In the example shown in FIG. 27, this direction is a lateral (horizontal) direction of the semiconductor body 200.

Referring to FIG. 27, the transistor device further includes a first gate electrode 221 and a second gate electrode 231. These first and second gate electrodes 221, 231 are spaced apart from each other in the current flow direction of the transistor device, wherein the first gate electrode 221 is closer to the source electrode 213 than the second gate electrode 231. The second gate electrode 231 is closer to the drain electrode 214 than the first gate electrode 221. According to one example, as shown in FIG. 207, a distance between the first gate electrode 221 and the source electrode 213 is shorter than the distance between the second gate electrode 231 and the drain electrode 214. According to one example, a distance between the second gate electrode 231 and the drain electrode 214 is more than three times, more than five times, or more than ten times a distance between the first gate electrode 221 and the source electrode 213. In the example shown in FIG. 27, the transistor device further includes a third semiconductor layer 230 of a group III nitride. The semiconductor layer 230 adjoins the second semiconductor layer 220 and separates the first gate electrode 221 and the second gate electrode 231 from the second semiconductor layer 220, wherein both the first gate electrode 221 and the second gate electrode 231 adjoin the third semiconductor layer 230. Optionally, a passivation layer 240 covers those regions of the third semiconductor layer 230 that are not covered by the first gate electrode 221 and the second gate electrode 231. Optionally, a field electrode 225 adjoins the second gate electrode 231 but does not adjoin the third semiconductor layer 230. That is, the field electrode 225 is spaced apart from the third semiconductor layer 230.

According to one example, the first type group III nitride of the first semiconductor layer 210 is gallium nitride (GaN), and the second type group III nitride of the second semiconductor layer 220 is a gallium alloy nitride such as, for example, aluminum gallium nitride (AlGaN), indium gallium nitride (InGaN), aluminum indium gallium nitride (AlInGaN), or the like. According to one example, the third semiconductor layer 230 includes the first type group III nitride. Each of the first gate electrode 221, the second gate electrode 231, the source electrode 213, the drain electrode 214, and the optionally field electrode 225 includes an electrically conducting material which may include one or more of polycrystalline silicon, a metal silicide, metals like e.g., aluminum, copper, nickel, titanium, tantalum, gold, conductive ceramics like e.g., titanium nitride or the like. According to one example, materials of the source electrode 213 and the drain electrode 214 are chosen such that there is an ohmic contact between the source electrode 213 and each of the first semiconductor layer 210 and the second semiconductor layer 220 and that there is an ohmic contact between the drain electrode 214 and each of the first semiconductor layer 210 and the second semiconductor layer 220.

According to one example the first layer 210 and the third layer 230 are p-doped semiconductor layers. A doping concentration is, for example, higher than 1E15 cm$^{-3}$, higher than 1E17 cm$^{-3}$, or even higher than 1E19 cm$^{-3}$. According to one example, the first and second layers 210, 230 are GaN layers doped with magnesium (Mg). The third layer is an AlGaN layer, for example, in which the dopant is aluminum (Al). These layers 210, 220, 230 may be formed and doped by epitaxial growth processes.

The HEMT device shown in FIG. 27 is a normally-on device. That is, the transistor device is an on-state when each of the first drive voltage $V_{G1S}$, $V_{G2S}$ is zero. In the on-state, the 2DEG forms a conducting channel between the source electrode 213 and the drain electrode 214.

The HEMT device shown in FIG. 27 can be switched off by generating the first and second drive voltages $V_{G1S}$, $V_{G2S}$ in accordance with one of the timing diagrams shown in FIGS. 13 and 14, for example. The first on-level \Tom and the second on-level $V_{ON2}$ are zero or positive voltage levels, while each of the first off-level $V_{OFF1}$, $V_{OFF2}$ is a negative voltage level. According to one example, each of the first off-level and the second off-level is selected from a range of between −1V and −3V. Like in the examples explained before, the first on-level $V_{ON1}$ and the second on-level $V_{ON2}$ can be substantially equal or can be different from each other. Likewise, the first off-level $V_{OFF1}$ and the second off-level $V_{OFF2}$ can be substantially equal or can be different from each other. In the off-state, the first gate electrode 221 interrupts a first conducting channel, which is a section of the 2DEG below the first gate electrode 221, and the second gate electrode 231 interrupts a second conducting channel, which is a section of the 2DEG below the second gate electrode 231. When the transistor device is in the off-state it can be switched on by generating the first drive voltage $V_{G1S}$, $V_{G2S}$ in accordance with one of the timing diagrams shown in FIGS. 6 to 9.

Figure 28:
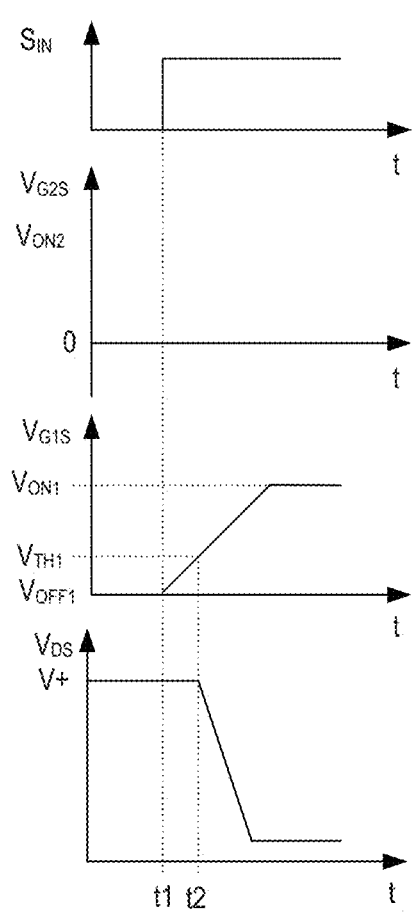
FIGS. 28 and 29 show timing diagrams that illustrate one example of how the HEMT shown in FIG. 27 can be switched on and off, respectively.
Figure 29:
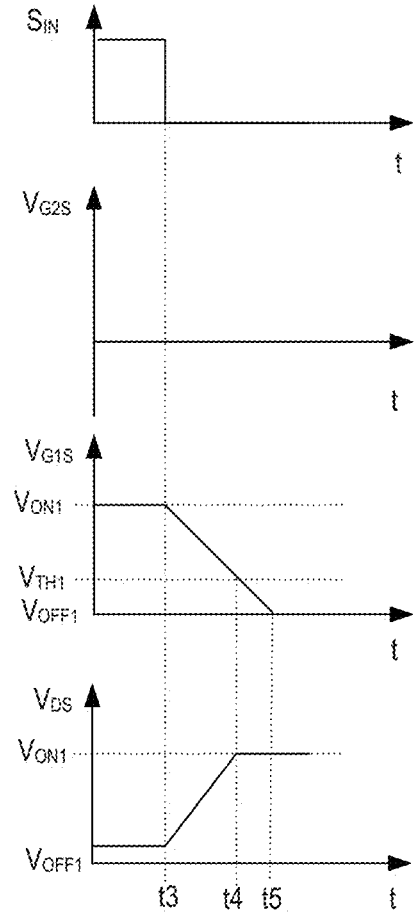

An alternative method for switching on the HEMT device shown in FIG. 27 is illustrated in FIG. 28, and an alternative method for switching off the HEMT device shown in FIG. 27 is illustrated in FIG. 29. Each of these Figures shows timing diagrams of the input signal $S_{IN}$, the first and second drive voltages $V_{G1S}$, $V_{G2S}$, and the drain-source voltage $V_{DS}$. The methods illustrated in FIGS. 28 and 29 are different from the methods explained before in that the second drive voltage $V_{G2S}$ is zero throughout the different operation states of the transistor device. This can be obtained, for example, by electrically connecting the second gate node G2 with the source node S. In this example, the operation state of the HEMT device is only controlled by the first drive voltage $V_{G1S}$. When, for example, a positive voltage is applied between the drain node D and the source node S and the first gate electrode 221 is driven such that it interrupts the 2DEG an electrical potential in the first and second semiconductor layers 210, 220 increases beginning at the source electrode 213, wherein this increasing electrical potential (in connection with the electrical potential of the second gate electrode 231 being clamped to the electrical potential of the source electrode 213) also causes the 2DEG below the second gate electrode 231 to be interrupted. In this way, the first conducting channel below the first gate electrode 221 and the second conducting channel below the second gate electrode 231 are interrupted.

Figure 30:
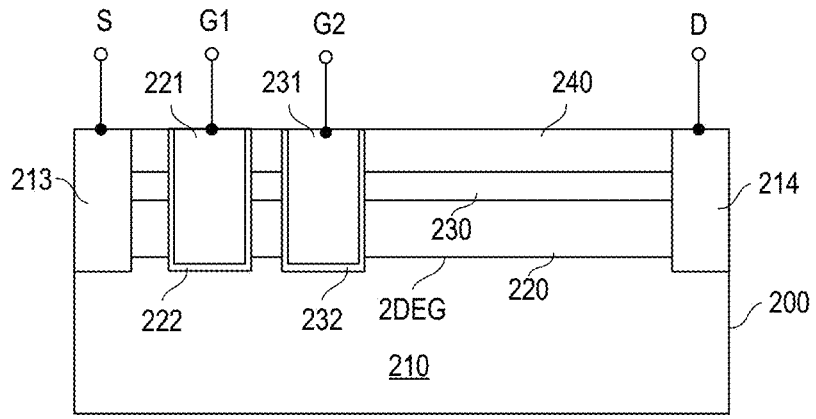
FIG. 30 shows vertical cross sectional view of a HEMT according to another example.

FIG. 30 shows one example of a normally-off HEMT. In this example, the first gate electrode 221 extends through the second semiconductor layer 220 into the first semiconductor layer 210 and is dielectrically insulated from these semiconductor layers 210, 220 by a gate dielectric 222. Equivalently, the second gate electrode 231 extends through the second semiconductor layer 220 into the first semiconductor layer 210 and is dielectrically insulated from these semiconductor layers 220, 210 by a second gate dielectric 232. In this transistor device there is a 2DEG between the first gate electrode 221 and the source electrode 213, between the two gate electrodes 221, 231 and between the second gate electrode 231 and the drain electrode 214. The 2DEG, however, is interrupted by the two gate electrodes 221, 231. The transistor device is in the on-state when drive voltages $V_{G1S}$, $V_{G2S}$ are applied to the first and second gate nodes G1, G2 such that conducting channels are generated in the first semiconductor layer 210 along the first and second gate dielectrics 222, 232. The normally off-HEMT shown in FIG. 30 can be switched on and off in the same way as any of the normally-off devices explained herein before. According to one example, each of the first on-level $V_{ON1}$ and the second on-level $V_{ON2}$ is a positive level, and each of the first off-level $V_{OFF1}$ and the second off-level $V_{ON1}$, $V_{ON2}$ is zero or a negative level. According to one example, each of the first and second on-levels is selected from a range of between 3V and 10V. The conducting channels generated by the gate electrodes 221, 231 when a suitable drive potential is applied are inversion channels, for example.

Figure 31:
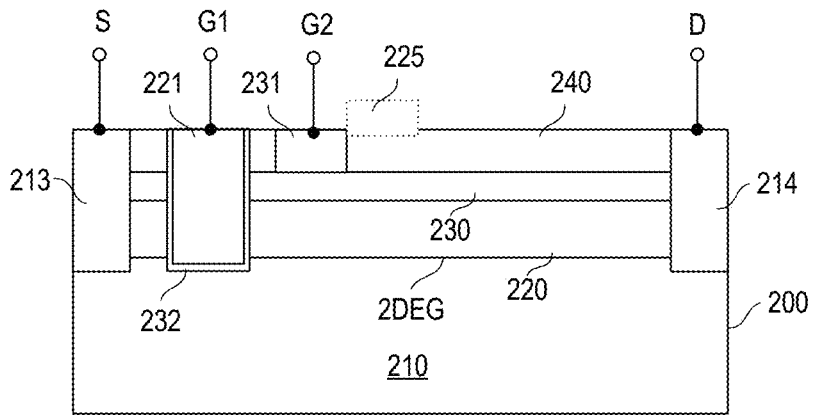
FIG. 31 shows a modification of the HEMT shown in FIG. 30.

FIG. 31 shows a combination of the transistor devices shown in FIGS. 27 and 30. In this example, the first gate electrode 221 is of the same type as the first gate electrode 221 shown in FIG. 30 and the second gate electrode 231 is of the same type as the second gate electrode 231 explained with reference to FIG. 27. In this example, the on-level $V_{ON1}$ and off-level $V_{OFF1}$ of the first drive voltage $V_{G1S}$ may be as explained in context with the first gate electrode 221 in the device shown in FIG. 30, and the on-level $V_{ON2}$ and off-level $V_{OFF2}$ of the second drive voltage $V_{G2S}$ may be as explained in context with the second gate electrode 231 in the device shown in FIG. 30.

Figure 32:
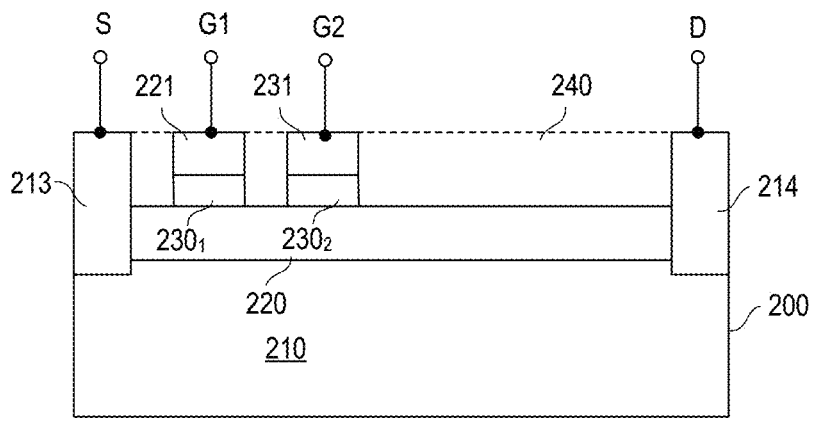
FIG. 32 shows a vertical cross sectional view of a GIT (Gate Injection Transistor) according to one example.

FIG. 32 shows a vertical cross-sectional view of a GIT device according to one example. This transistor device is different from the HEMT device explained before in that the first semiconductor layer 210 and the second semiconductor layer 220 are intrinsic layers. According to one example, "intrinsic" means that a doping concentration is less than $1E14$ cm$^{-3}$, less than $1E13$ cm$^{-3}$, or even less than $1E12$ cm$^{-3}$. The third semiconductor layer includes two sections, a first section $230_1$ between the first gate electrode 221 and the second semiconductor layer 220, and the second section $230_2$ between the second gate electrode 231 and the second semiconductor layer 220. These layer sections $230_1$, $230_2$ are doped semiconductor layers. According to one example, these layer sections $230_1$, $230_2$ are p-doped. According to one example, a doping concentration of these layer sections is higher than $1E14$ cm$^{-3}$, higher than $1E16$ cm$^{-3}$, or even higher than $1E18$ cm$^{-3}$. Everything else that has been explained with reference to the first, second and third semiconductor layers 210, 220, 230 above applies to the first, second and third semiconductor layers shown in FIG. 32 equivalently. The GIT device shown in FIG. 32 is a normally-off device. In this type of device there is a 2DEG between the first semiconductor layer 210 and the second semiconductor layer 220, wherein the doped layer sections $230_1$, $230_2$ below the gate electrodes 221, 231 cause the 2DEG to be depleted below the layer sections $230_1$, $230_2$ when the drive voltages are zero or below. A 2DEG is generated below the respective layer section when a drive voltage (gate-source voltage) is applied to the respective gate node G1, G2 such that charge carriers (holes) are injected by the layer sections $230_1$, $230_2$ into the second layer 220. These charge carriers in the second layer 220 cause further charge carriers (electrons) in the first layer 210 to move to the interface between the first and second layer 210, 220 and form a 2DEG. This device can be switched on an off in the same way as any of the normally-off devices explained herein before. According to one example, the on-levels $V_{ON1}$, $V_{ON2}$ are selected from a range of between 0.5V and 10V, in particular between +2V and +5V, and the off-levels $V_{OFF1}$, $V_{OFF2}$ are selected from a range of between −15V and 0V, in particular between −10V and −2V.

In the examples explained above, drive signals applied to the first and second gate node G1, G2 in order to switch on or off the transistor device are drive voltages, such as gate-source voltages. However, there are types of transistor devices, such as the GIT, that can also be switched on or off dependent on a current driven into the respective gate node G1, G2. Thus, in particular in a GIT, the drive signal may be a drive current as well or, as a further alternative, may be a drive current for turning-on the device and drive voltage for turning-off the device. Everything that has been explained before with regard to driving a transistor device based on drive voltages applies to driving a transistor device, such as a GIT, based on a drive current as well. In particular, timing diagrams of drive currents may correspond to the timing diagrams of drive voltages explained before. That is, when switching on, for example, a drive current driven into the second gate node G2 may increase more rapidly (before the current driven into the first gate node G1 increases) than a drive current driven into the first gate node G1. And, when switching off, the drive current driven into the second gate node G2 may decrease more rapidly (after the current driven into the first gate node G1) than the drive current driven into the first gate node G1.

Figure 33:
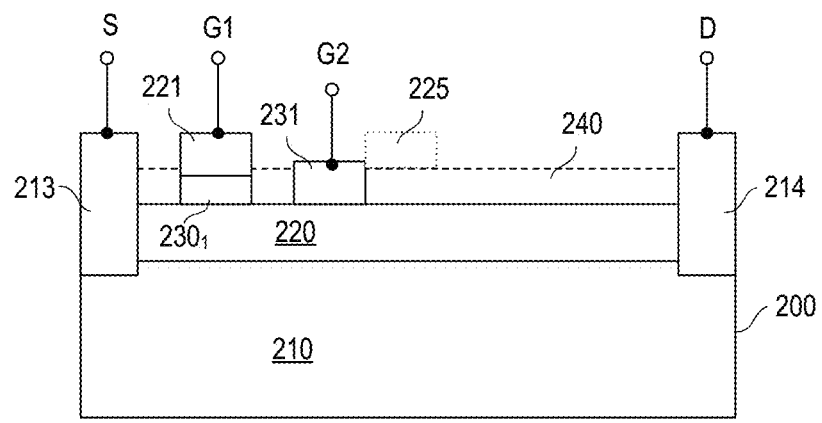
FIG. 33 shows a modification of the GIT shown in FIG. 32.

FIG. 33 shows a combination of the transistor devices shown in FIGS. 27 and 32. In this example, the first gate electrode 221 is of the same type as the first gate electrode 221 shown in FIG. 32. This type of gate electrode may be referred to as GIT gate. The second gate electrode 231 adjoins the second semiconductor layer 220 in this example and may be referred to as HEMT gate. In this example, the first gate 221 in connection with the first layer 230, generates a 2DEG at the interface between the first and second layers 210, 220 below the first gate electrode 221 when a drive signal with an on-level is applied, wherein an on-level is one of the on-levels explained with reference to FIG. 32, for example. The second gate 231 in connection with the second layer $230_2$ generates a 2DEG at the interface between the first and second layers 210, 220 below the second gate electrode when a drive signal with an on-level is applied, wherein an on-level is one of the on-levels explained with reference to FIG. 27, for example.

Figure 34:
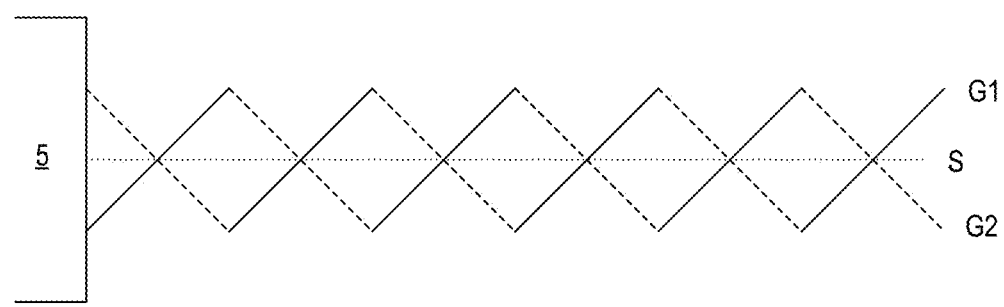
FIG. 34 shows one example of how lines between a driver, a source and two gate node of a double gate transistor device may be arranged.

FIG. 34 shows one example of how connection lines between the driver and the gate and source nodes S, G1, G2 may be arranged in order to largely avoid magnetic or capacitive crosstalk. These lines are referred to as gate and source lines in the following. In this example, each of the gate lines crosses the source line several times in different layers. Just for the purpose of illustration it may be assumed that those sections of the zig-zag gate lines that are drawn in solid lines cross the source line in a first layer above the source line and that those sections of the zig-zag gate lines that are drawn in dashed lines cross the source lines in a second layer below the source line. The source line may also be zig-zag-shaped (not shown in FIG. 34). In this example, each of the gate lines alternatingly crosses the source line in the first layer and the second layer. The layer sections of one gate line may be connected by connectors, such as vias. These connectors, which extend in a direction perpendicular to the drawing plane shown in FIG. 34, are not shown. In each case, the gate lines and the source line are insulated from each other.

Examples of methods explained before relate to switching on or switching off a transistor device. Switching on may include generating a first conducting channel by driving a first gate electrode and, before generating the first conducting channel, generating a second conducting channel by driving a second gate electrode. Switching off may include interrupting a first conducting channel by driving a first gate electrode and, after interrupting the first conducting channel, interrupting a second conducting channel by driving a second gate electrode. Referring to the above, generating the first conducting channel may include generating an on-level of a first drive signal (e.g., a drive voltage) applied to the first gate electrode, and interrupting the conducting channel may include generating an off-level of the first drive signal. Equivalently generating the second conducting channel may include generating an on-level of a second drive signal (e.g., a drive voltage) applied to the second gate electrode, and interrupting the conducting channel may include generating an off-level of the second drive signal. The on-level and the off-level are dependent on the specific type of transistor device.

The following examples may illustrate one or more aspects of the disclosure.

Example 1

A method including: switching on a transistor device by generating a first conducting channel by driving a first gate electrode and, before generating the first conducting channel, generating a second conducting channel by driving a second gate electrode, wherein the second gate electrode is adjacent the first gate electrode in a current flow direction of the transistor device.

Example 2

The method of example 1, wherein the transistor device is a field-effect controlled transistor device, wherein generating the first conducting channel includes generating the first conducting channel in a body region, wherein generating the second conducting channel includes generating the second conducting channel in the body region, wherein the first gate electrode is dielectrically insulated from the body region by a first gate dielectric, wherein the second gate electrode is dielectrically insulated from the body region by a second gate dielectric, wherein the second gate electrode is separated from the first gate electrode by a separation layer, and wherein the body region is arranged between a source region and a drift region, and wherein the drift region is arranged between body region and a drain region.

Example 3

The method of example 1, wherein the transistor device is a HEMT device.

Example 4

The method of example 3, wherein the HEMT device is a normally-on HEMT device.

Example 5

The method of example 3, wherein the HEMT device is a normally-off HEMT device.

Example 6

The method of example 1, wherein the transistor device is a GIT device.

Example 7

The method of example 6, wherein the GIT device includes a first injection gate adjoining the first gate electrode and a second injection gate adjoining the second gate electrode.

Example 8

The method of example 6, wherein the GIT device includes only one injection gate.

Example 9

The method of example 1, wherein driving the first gate electrode includes increasing a first drive signal, and wherein driving the second gate electrode includes increasing a second drive signal from a second off-level to a second on-level.

Example 10

The method of example 9, wherein driving the first gate electrode includes clamping the second gate electrode to the second on-level.

Example 11

The method of example 9, wherein the second off-level is different from the first off-level.

Example 12

The method of example 9, wherein driving the first gate electrode and the second gate electrode includes increasing the second drive signal faster than the first drive signal.

Example 13

The method of example 1, further including: detecting a change in an operation state of the transistor device, wherein detecting the operation state includes monitoring at least one electrical parameter of the second gate electrode.

Example 14

The method of example 13, wherein monitoring the at least one electrical parameter of the second gate electrode includes monitoring at least one of an electrical potential and a current to or from the second gate electrode.

Example 15

The method of example 14, wherein monitoring the at least one electrical parameter includes: filtering a signal representing a current to or from the second gate electrode to generate a filter signal; and comparing the filter signal with a threshold.

Example 16

The method of example 13, wherein detecting the change of the operation state includes detecting the change in the operation state if the filter signal reaches the threshold.

Example 17

The method of example 13, wherein driving the first gate electrode further includes driving the first gate electrode based on a detected change of the operation state.

Example 18

The method of example 17, wherein driving the first gate electrode based on a detected change of the operation state includes: driving the first gate electrode in accordance with a first drive parameter before the change of the operation state has been detected; and driving the first gate electrode in accordance with a second drive parameter different from the first drive parameter after the change of the operation state has been detected.

Example 19

The method of example 18, wherein the first drive parameter includes a first current level of a drive current into the first gate electrode and the second drive parameter includes a second current level of the drive current higher than the first current level.

Example 20

A method including: switching off a transistor device by interrupting a first conducting channel by driving a first gate electrode and, after interrupting the first conducting channel, interrupting a second conducting channel by driving a second gate electrode, wherein the second gate electrode is arranged adjacent the first gate electrode in a current flow direction of the transistor device.

Example 21

The method of example 20, wherein the transistor device is a field-effect controlled transistor device, wherein interrupting the first conducting channel includes interrupting the first conducting channel in a body region, wherein interrupting the second conducting channel includes interrupting the second conducting channel in the body region, wherein the first gate electrode is dielectrically insulated from the body region by a first gate dielectric, wherein the second gate electrode is dielectrically insulated from the body region by a second gate dielectric, wherein the second gate electrode is separated from the first gate electrode by a separation layer, and wherein the body region is arranged between a source region and a drift region, and wherein the drift region is arranged between body region and a drain region.

Example 22

The method of example 20, wherein the transistor device is a HEMT device.

Example 23

The method of example 22, wherein the HEMT device is a normally-on HEMT device.

Example 24

The method of example 22, wherein the HEMT device is a normally-off HEMT device.

Example 25

The method of example 20, wherein the transistor device is a GIT device.

Example 26

The method of example 25, wherein the GIT device includes a first injection gate adjoining the first gate electrode and a second injection gate adjoining the second gate electrode.

Example 27

The method of example 25, wherein the GIT device includes only one injection gate.

Example 28

The method of example 20, wherein driving the first gate electrode includes decreasing a first drive signal from a first on-level to a first off-level, and wherein driving the second gate electrode includes decreasing a second drive signal between the second gate electrode and the source region from a second on-level to a second off-level.

Example 29

The method of example 28, wherein driving the first gate electrode includes clamping the second gate electrode to the second on-level.

Example 30

The method of example 28, wherein the second off-level is different from the first off-level.

Example 31

The method of example 28, wherein driving the first gate electrode and the second gate electrode includes decreasing the second drive signal faster than the first drive signal.

Example 32

The method of example 20, further including: detecting a change in an operation state of the transistor device, wherein detecting the operation state includes monitoring at least one electrical parameter of the second gate electrode.

Example 33

The method of example 32, wherein monitoring the at least one electrical parameter of the second gate electrode includes monitoring at least one of an electrical potential and a current to or from the second gate electrode.

Example 34

The method of example 33, wherein monitoring the at least one electrical parameter includes: filtering a signal representing a current to or from the second gate electrode to obtain a filter signal; and comparing the filter signal with a threshold.

Example 35

The method of example 34, wherein detecting the change of the operation state includes detecting the change in the operation state if the filter signal reaches a threshold.

Example 36

The method of example 32, wherein driving the first gate electrode further includes driving the first gate electrode based on a detected change of the operation state.

Example 37

The method of example 36, wherein driving the first gate electrode based on a detected change of the operation state includes: driving the first gate electrode in accordance with a first drive parameter before the change of the operation state has been detected; and driving the first gate electrode in accordance with a second drive parameter different from the first drive parameter after the change of the operation state has been detected.

Example 38

The method of example 37, wherein the first drive parameter includes a first current level of a drive current into the first gate electrode and the second drive parameter includes a second current level of the drive current higher than the first current level.

Example 39

A method, including: driving a first gate electrode of a transistor device and monitoring at least one electrical parameter of a second gate electrode of the transistor device.

Example 40

The method of example 39, wherein the transistor device is a field-effect controlled transistor device, wherein the first gate electrode is dielectrically insulated from a body region by a first gate dielectric, wherein the second gate electrode is dielectrically insulated from the body region by a second gate dielectric, arranged adjacent the first gate electrode, and separated from the first gate electrode by a separation layer, and wherein the body region is arranged between a source region and a drift region, and wherein the drift region is arranged between body region and a drain region.

Example 41

The method of example 39, wherein the transistor device is one of a HEMT device and a GIT device.

Example 42

The method of example 39, wherein monitoring the at least one electrical parameter of the second gate electrode includes monitoring at least one of an electrical potential and a current to or from the second gate electrode.

Example 43

A transistor device comprising at least one transistor cell, wherein the at least one transistor cell includes: a drift region, a body region, a source region and a drain region, wherein the body region is arranged between the source region and the drift region, and wherein the drift region is arranged between body region and the drain region; a first gate electrode dielectrically insulated from the body region by a first gate dielectric; and a second gate electrode, wherein the second gate electrode is dielectrically insulated from the body region by a second gate dielectric, arranged adjacent the first gate electrode, and separated from the first gate electrode by a separation layer.

Example 44

The transistor device of example 43, wherein the separation layer includes a dielectric layer.

Example 45

The transistor device of example 43, comprising a plurality of transistor cells, wherein each of the plurality of transistor cells has its respective source region connected to a source node common to the plurality of transistor cells, wherein each of the plurality of transistor cells has its respective first gate electrode connected to a first gate node common to the plurality of transistor cells, and wherein each of the plurality of transistor cells has its respective second gate electrode connected to a second gate node common to the plurality of transistor cells.

Example 46

The transistor device of example 43, wherein the drain region has a doping concentration higher than a doping concentration of the drift region.

Example 47

The transistor device of example 46, wherein a doping concentration of the drain region is at least 1E3 times or 1E4 times a doping concentration of the drift region.

Example 48

The transistor device of example 46, wherein a doping type of the drain region equals a doping type of the drift region.

Example 49

The transistor device of example 46, wherein a doping type of the drain region is complementary to a doping type of the drift region.

Example 50

The transistor device of example 43, wherein a doping concentration of the body region is such that an integral of the doping concentration of the body region along a path that begins at a junction between the drift region and a body region and extends along the second gate electrode is higher than a breakthrough charge of a semiconductor material of the body region.

Example 51

The transistor device of example 43, wherein the transistor device includes a current flow direction, and wherein the second gate electrode is adjacent the first gate electrode in the current flow direction.

Example 52

A transistor device, including: a semiconductor body with a first semiconductor layer comprising a first type of group III nitride and a second semiconductor layer adjoining the first semiconductor layer and comprising a second type group III nitride;
a source electrode connected to the first semiconductor layer and the second semiconductor layer; a drain electrode spaced apart from the source electrode and connected to the first semiconductor layer and the second semiconductor layer; and a first gate electrode and a second gate electrode that are spaced apart in a current flow direction of the transistor device.

Example 53

The transistor device of example 52, wherein the semiconductor body further includes a third semiconductor layer adjoining the second semiconductor layer and comprising a group III nitride, and wherein at least one of the first gate electrode and the second gate electrode adjoins the third semiconductor layer and is separated from the second semiconductor layer by the third semiconductor layer.

Example 54

The transistor device of example 52, wherein at least one of the first gate electrode and the second gate electrode extends through the second semiconductor layer into the first semiconductor layer and is dielectrically insulated from the second semiconductor layer and the first semiconductor layer by a gate dielectric.

Example 55

The transistor device of example 52, wherein each of the first semiconductor layer and the second semiconductor layer is a doped semiconductor layer.

Example 56

The transistor device of example 52, wherein each of the first semiconductor layer and the second semiconductor layer is an intrinsic semiconductor layer.

Example 57

The transistor device of example 56, wherein the semiconductor body further includes at least one third semiconductor layer adjoining the second semiconductor layer and comprising a doped group III nitride, and wherein at least one of the first gate electrode and the second gate electrode adjoins the at least one third semiconductor layer and is separated from the second semiconductor layer by the third semiconductor layer.

Example 58

The transistor device of example 57, wherein the first gate electrode adjoins the at least one third semiconductor layer, and wherein the second gate electrode adjoins the second semiconductor layer.

Example 59

The transistor device of example 52, further including: a field electrode adjoining the second gate electrode.

Example 60

The transistor device of example 52, wherein the second gate electrode is electrically connected with the source electrode.

Example 61

The transistor device of example 52, wherein the first type of group III nitride includes gallium nitride (GaN), and wherein the second type of group III nitride includes aluminum gallium nitride (AlGaN).

Example 62

A drive circuit, including: an input configured to receive an input signal; a first output configured to be coupled to a first gate node of a transistor device; and a second output configured to be coupled to a second gate node of a transistor device, wherein the drive circuit is configured to drive the first gate node and the second gate node based on the input signal, wherein the drive circuit is configured to detect an operation state of the transistor device based on monitoring at least one electrical parameter at the second output.

Example 63

The drive circuit according to example 62, wherein the drive circuit is configured to adjust a time scheme of driving the first gate node based on detecting the operation state.

Example 64

A drive circuit, comprising: an input configured to receive an input signal; a first output configured to be coupled to a first gate node of a transistor device; and a second output configured to be coupled to a second gate node of a transistor device; and wherein the drive circuit is configured to operate in a diagnostic mode, wherein in the diagnostic mode, the transistor device is configured to diagnose the transistor device based on driving the first gate node via the first output and monitoring at least one electrical parameter at the second output.

Example 65

The drive circuit of example 64, wherein the drive circuit is further configured to operate in a drive mode, wherein in the drive mode the drive circuit is configured to drive the first gate node and the second gate node based on the input signal.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A transistor device comprising:
a semiconductor body with a first semiconductor layer comprising a first type of group III nitride and a second semiconductor layer adjoining the first semiconductor layer and comprising a second type of group III nitride;
a source electrode having a vertical edge immediately adjacent to a first vertical edge of the first semiconductor layer and immediately adjacent to a first vertical edge of the second semiconductor layer in a vertical cross-sectional view;
a drain electrode spaced apart from the source electrode and having a vertical edge immediately adjacent to a second vertical edge of the first semiconductor layer and immediately adjacent to a second vertical edge of the second semiconductor layer in a vertical cross-sectional view; and
a first gate electrode configured for generating a first conducting channel in the semiconductor body in response to a first signal driving the first gate electrode at a first slew rate and a second gate electrode configured for generating a second conducting channel in the semiconductor body in response to a second signal driving the second gate electrode at a second slew rate greater than the first slew rate, wherein the first gate electrode and the second gate electrode are spaced apart in a current flow direction of the transistor device,
wherein the first gate electrode and the second gate electrode are electrically insulated with respect to each other, and wherein the first gate electrode and the second gate electrode are controlled individually with respect to each other in a mode of operation,
wherein each of the first gate electrode and the second gate electrode extends through the second semiconductor layer into the first semiconductor layer and is dielectrically insulated from the second semiconductor layer and the first semiconductor layer by a gate dielectric.

2. The transistor device of claim 1, wherein the semiconductor body further comprises a third semiconductor layer adjoining the second semiconductor layer and comprising a group III nitride, and wherein each of the first gate electrode and the second gate electrode further extends through the third semiconductor layer and is further dielectrically insulated from the third semiconductor layer by the gate dielectric.

3. The transistor device of claim 1, wherein each of the first semiconductor layer and the second semiconductor layer comprises a doped semiconductor layer.

4. The transistor device of claim 1, wherein each of the first semiconductor layer and the second semiconductor layer comprises an intrinsic semiconductor layer.

5. The transistor device of claim 4, wherein the semiconductor body further comprises at least one third semiconductor layer adjoining the second semiconductor layer and comprising a doped group III nitride, and wherein each of the first gate electrode and the second gate electrode further extends through the at least one third semiconductor layer and is further dielectrically insulated from the at least one third semiconductor layer by the gate dielectric.

6. The transistor device of claim 1, further comprising a field electrode adjoining the second gate electrode.

7. The transistor device of claim 1, wherein the second gate electrode is electrically connected with the source electrode.

8. The transistor device of claim 1, wherein the first type of group III nitride comprises gallium nitride (GaN), and wherein the second type of group III nitride comprises aluminum gallium nitride (AlGaN).

9. A method of using a transistor device, the method comprising:
with a first gate electrode of the transistor device, generating a first conducting channel in a semiconductor body in response to a first signal driving the first gate electrode at a first slew rate, wherein the semiconductor body has a first semiconductor layer comprising a first type of group III nitride and a second semiconductor layer adjoining the first semiconductor layer and comprising a second type of group III nitride; and
with a second gate electrode of the transistor device, generating a second conducting channel in the semiconductor body in response to a second signal driving the second gate electrode at a second slew rate greater than the first slew rate, wherein the first gate electrode and the second gate electrode are spaced apart in a current flow direction of the transistor device,
wherein the first gate electrode and the second gate electrode are electrically insulated with respect to each other, and wherein the first gate electrode and the second gate electrode are controlled individually with respect to each other in a mode of operation,
wherein each of the first gate electrode and the second gate electrode extends through the second semiconductor layer into the first semiconductor layer and is dielectrically insulated from the second semiconductor layer and the first semiconductor layer by a gate dielectric,
wherein, in a vertical cross-sectional view, a source electrode has a vertical edge immediately adjacent to a first vertical edge of the first semiconductor layer and immediately adjacent to a first vertical edge of the second semiconductor layer, and
wherein, in a vertical cross-sectional view, a drain electrode is spaced apart from the source electrode and has a vertical edge immediately adjacent to a second vertical edge of the first semiconductor layer and immediately adjacent to a second vertical edge of the second semiconductor layer.

10. The method of claim 9, wherein the semiconductor body further comprises a third semiconductor layer adjoining the second semiconductor layer and comprising a group III nitride, and wherein each of the first gate electrode and the second gate electrode further extends through the third semiconductor layer and is further dielectrically insulated from the third semiconductor layer by the gate dielectric.

11. The method of claim 9, wherein each of the first semiconductor layer and the second semiconductor layer comprises a doped semiconductor layer.

12. The method of claim 9, wherein each of the first semiconductor layer and the second semiconductor layer comprises an intrinsic semiconductor layer.

13. The method of claim 12, wherein the semiconductor body further comprises at least one third semiconductor layer adjoining the second semiconductor layer and comprising a doped group III nitride, and wherein each of the first gate electrode and the second gate electrode further extends through the at least one third semiconductor layer and is further dielectrically insulated from the at least one third semiconductor layer by the gate dielectric.

14. The method of claim 9, wherein a field electrode adjoins the second gate electrode.

15. A method of forming a transistor device, the method comprising:
- forming a semiconductor body with a first semiconductor layer comprising a first type of group III nitride and a second semiconductor layer adjoining the first semiconductor layer and comprising a second type of group III nitride;
- forming a source electrode having a vertical edge immediately adjacent to a first vertical edge of the first semiconductor layer and immediately adjacent to a first vertical edge of the second semiconductor layer in a vertical cross-sectional view;
- forming a drain electrode spaced apart from the source electrode and having a vertical edge immediately adjacent to a second vertical edge of the first semiconductor layer and immediately adjacent to a second vertical edge of the second semiconductor layer in a vertical cross-sectional view; and
- forming a first gate electrode configured for generating a first conducting channel in the semiconductor body in response to a first signal driving the first gate electrode at a first slew rate and a second gate electrode configured for generating a second conducting channel in the semiconductor body in response to a second signal driving the second gate electrode at a second slew rate greater than the first slew rate, wherein the first gate electrode and the second gate electrode are spaced apart in a current flow direction of the transistor device,
- wherein the first gate electrode and the second gate electrode are electrically insulated with respect to each other, and wherein the first gate electrode and the second gate electrode are controlled individually with respect to each other in a mode of operation,
- wherein each of the first gate electrode and the second gate electrode extends through the second semiconductor layer into the first semiconductor layer and is dielectrically insulated from the second semiconductor layer and the first semiconductor layer by a gate dielectric.

16. The method of claim 15, wherein the semiconductor body further comprises a third semiconductor layer adjoining the second semiconductor layer and comprising a group III nitride, and wherein each of the first gate electrode and the second gate electrode further extends through the third semiconductor layer and is further dielectrically insulated from the third semiconductor layer by the gate dielectric.

17. The method of claim 15, wherein each of the first semiconductor layer and the second semiconductor layer comprises a doped semiconductor layer.

18. The method of claim 15, wherein each of the first semiconductor layer and the second semiconductor layer comprises an intrinsic semiconductor layer.

19. The method of claim 18, wherein the semiconductor body further comprises at least one third semiconductor layer adjoining the second semiconductor layer and comprising a doped group III nitride, and wherein each of the first gate electrode and the second gate electrode further extends through the at least one third semiconductor layer and is further dielectrically insulated from the at least one third semiconductor layer by the gate dielectric.

20. The method of claim 15, wherein a field electrode adjoins the second gate electrode.

\* \* \* \* \*